United States Patent
Hsu et al.

(10) Patent No.: US 9,419,615 B2
(45) Date of Patent: Aug. 16, 2016

(54) DRIVER CIRCUIT

(71) Applicant: TAIWAN SEMICONDUCTOR MANUFACTURING COMPANY, LTD., Hsinchu (TW)

(72) Inventors: Ying-Yu Hsu, Hsinchu (TW); Chien-Chun Tsai, Jhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/600,727

(22) Filed: Jan. 20, 2015

(65) Prior Publication Data

US 2016/0211848 A1 Jul. 21, 2016

(51) Int. Cl.
*H03B 1/00* (2006.01)
*H03K 3/00* (2006.01)
*H03K 19/0175* (2006.01)

(52) U.S. Cl.
CPC .............. *H03K 19/017509* (2013.01)

(58) Field of Classification Search
CPC .............. H03K 17/687; H03K 5/13
USPC ......... 327/108–112, 333, 261, 427, 434, 437, 327/530, 538, 541, 543; 326/82, 83, 87
See application file for complete search history.

(56) References Cited

U.S. PATENT DOCUMENTS

| | | | |
|---|---|---|---|
| 8,344,760 B2* | 1/2013 | Du | G11C 7/1051 327/108 |
| 8,405,442 B2 | 3/2013 | Chen | |
| 8,436,671 B2 | 5/2013 | Chern et al. | |
| 8,610,488 B2* | 12/2013 | Yu | H03K 19/018507 327/112 |
| 8,625,240 B2 | 1/2014 | Chung et al. | |
| 8,791,722 B2* | 7/2014 | Lee | H03K 19/00315 326/87 |
| 8,847,659 B1 | 9/2014 | Lan et al. | |
| 9,172,376 B2* | 10/2015 | Chen | H03K 19/018521 |
| 2010/0271118 A1* | 10/2010 | Bhattacharya | H03K 19/018528 327/543 |
| 2014/0266386 A1 | 9/2014 | Huang et al. | |
| 2016/0072502 A1* | 3/2016 | Chern | H03K 17/687 327/261 |

* cited by examiner

*Primary Examiner* — Lincoln Donovan
*Assistant Examiner* — Thomas Skibinski
(74) *Attorney, Agent, or Firm* — Hauptman Ham, LLP

(57) ABSTRACT

A circuit comprises a voltage supply node, a reference voltage node, and a plurality of transistors coupled with the voltage supply node and the reference voltage node. The circuit also comprises a circuit input, a first delay element and a second delay element. The first delay element is coupled with the circuit input and one transistor of the plurality of transistors. The second delay element is coupled with the circuit input and a second transistor of the plurality of transistors. The circuit further comprises a circuit output coupled with the first transistor of the plurality of transistors and the second transistor of the plurality of transistors. The circuit additionally comprises a bias generator coupled with the circuit output, the first transistor of the plurality of transistors and the second transistor of the plurality of transistors.

20 Claims, 15 Drawing Sheets

DRIVER CIRCUIT

BACKGROUND

Advancements in technology continue to create challenges in designing smaller, faster and more complicated integrated circuits having increased functionality. Some integrated circuits interface with external components that operate at different voltages than the integrated circuit, or have an effect on the integrated circuit that affects the performance of the integrated circuit. The physical dimensions of transistors are often reduced with each new generation of various integrated circuits. Some transistors are designed to operate at voltage levels of about 1.8 volts or less. But, some external electrical systems, components or elements that interface with an input/output pad of the integrated circuit may operate at voltage levels that are higher than the voltage levels of the transistors, such as voltage levels of about 5 volts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
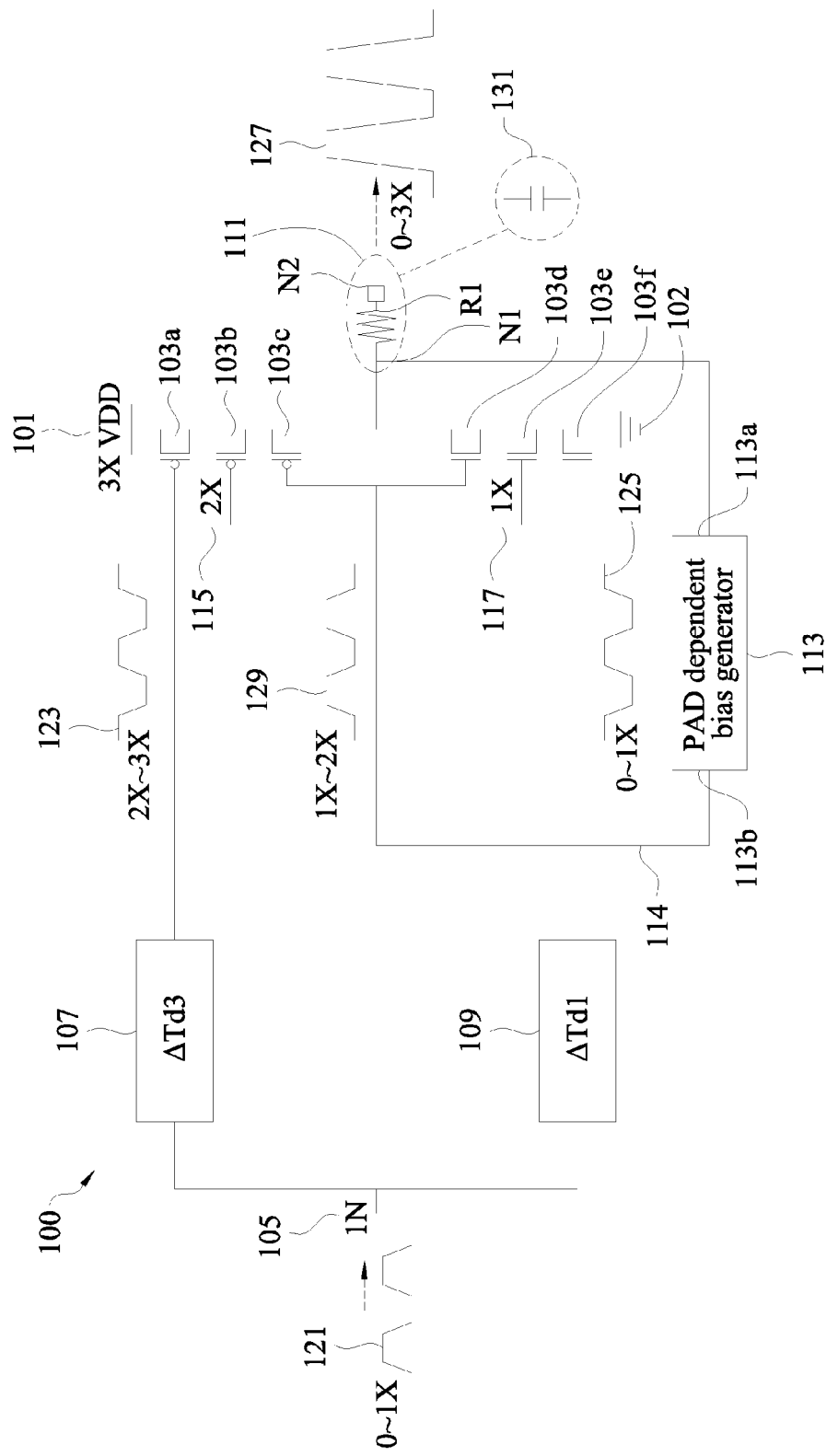
FIG. 1 is a schematic diagram of a driver circuit, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some integrated circuits comprise transistors that are designed to operate at voltage levels that are lower than the voltage levels at which some devices that interface with the integrated circuits are designed to operate. For example, some integrated circuits are designed to operate at or have a voltage tolerance of about 1.8 volts or less. Devices that interface with such integrated circuits are sometimes designed to operate at higher voltages. For example, some 3.3 volt applications like USB 1.1 or an SD card interfaces are sometimes designed to interface with integrated circuits that have transistors designed with voltage tolerances of about 1.2 volts or below. The smaller physical dimensions of some transistors make the transistors susceptible to performance degradation or damage that often results from the transistors being subjected to voltages that are above an allowable voltage tolerance and/or the hot carrier injection effect.

FIG. 1 is a schematic diagram of a driver circuit 100, in accordance with one or more embodiments. Circuit 100 is configured to provide adaptive bias protection of one or more transistors included in the circuit 100 based on a voltage level of an output signal.

Circuit 100 comprises a voltage supply node 101, a reference voltage node 102, and a plurality of transistors 103a-103f (collectively referred to as transistor 103) coupled between the voltage supply node 101 and reference voltage node 102. Transistors 103a-103c are PMOS transistors, and transistors 103d-103f are NMOS transistors. In some embodiments, the transistors 103 comprise a different combination or arrangement of PMOS and/or NMOS transistors. Transistors 103 each comprise a source, a drain, and a gate.

Circuit 100 also comprises a circuit input 105, a first delay element 107 and a second delay element 109. The first delay element 107 is coupled with the circuit input 105 and transistor 103a. The second delay element 109 is coupled with the circuit input 105 and transistor 103f. In some embodiments, one or more of the first delay element 107 or the second delay element 109 comprise level shifters. Circuit 100 further comprises a circuit output 111 coupled with transistor 103c and transistor 103d. Circuit 100 additionally comprises a bias generator 113 coupled with the circuit output, transistor 103c and transistor 103d.

The reference voltage node 102 is configured to carry a reference voltage recognizable in circuit 100 as 0 volts or a ground voltage level. The voltage supply node 101 is configured to carry a first voltage 3X, where X=n volts (e.g., if X is 1V, then the first voltage is 3V). The source of transistor 103a is coupled with voltage supply node 101. The source of transistor 103b is coupled with the drain of transistor 103a. The gate of transistor 103*b* is configured to receive a first bias signal 115. The first bias signal 115 has a second voltage 2X that is less than the first voltage 3X. The source of transistor 103*c* is coupled with the drain of transistor 103*b*. The drain of transistor 103*d* is coupled with the drain of transistor 103*c*. The drain of transistor 103*e* is coupled with the source of transistor 103*d*. The gate of transistor 103*e* is configured to receive a second bias signal 117. The second bias signal 117 has a third voltage 1X that is less than the second voltage 2X. The second voltage 2X and the third voltage 1X have predetermined voltage values regardless the voltage level at circuit input 105. In some embodiments, the second voltage 2X and the third voltage 1X are fixed. The drain of transistor 103*f* is coupled with the source of transistor 103*e*. The source of transistor 103*f* is coupled with the reference voltage node 102.

Circuit input 105 is configured to receive an input signal 121 from a controller that comprises a processor and a memory (not shown). In some embodiments, the first bias signal 115 and the second bias signal 117 are supplied by the controller. The input signal 121 has a fourth voltage that is less than or equal to the third voltage 1X. Based on a logic condition of the input signal 121, the input signal 121 has a voltage swing ranging from the ground voltage level to the fourth voltage, or, in other words, a voltage swing that ranges from 0 to 1X. Input signal 121 comprises data for the circuit 100 to drive out in a transmission mode.

The first delay element 107 is configured to receive the input signal 121 from the circuit input 105 and to output a first delayed signal 123 to the gate of transistor 103*a*. The first delayed signal 123 has a fifth voltage that is greater than or equal to the second voltage 2X and less than or equal to the first voltage 3X. Based on a logic condition of the first delayed signal 123, the first delayed signal 123 has a voltage swing ranging from the second voltage to the first voltage, or, in other words, a voltage swing that ranges from 2X to 3X. In some embodiments, first delay element 107 causes the first delayed signal 123 to have the fifth voltage by adding the fourth voltage of the input signal 121 to the second voltage 2X. The first delayed signal 123 is out of phase with the input signal 121, as caused by the first delay element 107. In some embodiments, the first delayed signal 123 is out of phase with the input signal 121 by a predetermined amount. In some embodiments, if the first delayed signal 123 is 180 degrees out of phase, and if the input signal 121 is at a logic high, then the first delayed signal 123 is at a logic low.

The second delay element 109 is configured to receive the input signal 121 from the circuit input 105 and to output a second delayed signal 125 to the gate of transistor 103*f*. The second delayed signal 125 has a sixth voltage less than or equal to the third voltage 1X. Based on the logic condition of the second delayed signal 125, the second delayed signal 125 has a voltage swing ranging from the ground voltage level to the third voltage, or, in other words, a voltage swing that ranges from 0 to 1X. The second delayed signal 125 is out of phase with the input signal 121, as caused by the second delay element 109. In some embodiments, the second delayed signal 125 is out of phase with the input signal 121 by a predetermined amount. In some embodiments, if the second delayed signal 125 is 180 degrees out of phase, and if the input signal 121 is at a logic high, then the second delayed signal 125 is at a logic low. In some embodiments, the first delayed signal 123 and the second delayed signal 125 are out of phase with the input signal 121 by an equal amount. In some embodiments, though illustrated as being in-phase, the first delayed signal 123 and the second delayed signal 125 are out of phase with respect to one another. For example, in other circuit configurations, one or the first delay unit 107 or the second delay unit 109 is optionally configured to cause the first delayed signal 123 or the second delayed signal 125 to be delayed more than the other of the first delayed signal 123 or the second delayed signal 125.

Circuit output 111 is coupled with the drain of transistor 103*c* and the drain of transistor 103*d*. In a transmit mode, an output signal 127 is driven out by the circuit 100 at the circuit output 111. The output signal 127 has an output voltage that ranges from 0 to the first voltage 3X. Circuit output 111 comprises a first node N1, a resistor R1, and a second node N2 coupled in series. The second node N2 is an output pad. In some embodiments, the circuit output 111 excludes the resistor R1.

Bias generator 113 has an input 113*a* and an output 113*b*. The input 113*a* of the bias generator 113 is coupled with first node N1 of circuit output 111. The output 113*b* of the bias generator 113 is coupled with the gate of transistor 103*c* and the gate of transistor 103*d*. Bias generator 113 is coupled along a feedback path 14 that extends from first node N1 to the gates of transistors 103*c* and 103*d*. Bias generator 113 is configured to receive the output signal 127 by way of first node N1 and to output a third delayed signal 129. The third delayed signal 129 has a seventh voltage greater than or equal to the third voltage 1X and less than or equal to the second voltage 2X. Based on a logic condition of the third delayed signal 129, the third delayed signal 129 has a voltage swing ranging from the third voltage 1X to the second voltage 2X, or, in other words, a voltage swing that ranges from 1X to 2X. The third delayed signal 129 is out of phase with the input signal 121, as caused by the bias generator 113. In some embodiments, the third delayed signal 129 is out of phase with the input signal 121 by a predetermined amount. In some embodiments, if the third delayed signal 129 is 180 degrees out of phase, and if the input signal 121 is at a logic high, then the third delayed signal 129 is at a logic low. In some embodiments, two or more of the first delayed signal 123, the second delayed signal 125 and the third delayed signal 129 are out of phase with respect to the input signal 121 by an equal amount. In some embodiments, one or the first delay unit 107, the second delay unit 109 or the bias generator 113 is optionally configured to cause the first delayed signal 123, the second delayed signal 125 and the third delayed signal 129 to be out of phase with respect to one another. In some embodiments, the third delayed signal 129 is in-phase with the input signal 121.

Bias generator 113 is configured to determine a difference $\Delta V$ between the seventh voltage and an eighth voltage at the circuit output 111 in one or more of a receiver mode, a transmit mode, or a power-down mode. In some embodiments, the seventh voltage is indicative of a voltage level at the gates of transistors 103*c* and 103*d* and the eighth voltage is indicative of a voltage level at the drains of transistors 103*c* and 103*d*. Bias generator 113 is configured to adjust the seventh voltage of the third delayed signal 129 to maintain an absolute value $|\Delta V|$ of the difference $\Delta V$ between the voltage level at the gates of transistors 103*c* and 103*d* and the voltage level at the drains of transistors 103*c* and 103*d* to be less than or equal to the third voltage 1X. Bias generator 113 adjusts the third delayed signal 129 to maintain the absolute value $|\Delta V|$ of the difference $\Delta V$ to account for coupled devices that operate at high voltages or changes in external capacitance loading.

If the circuit output 111 is interfacing with a device that has an operating voltage that is greater than a voltage tolerance of the transistors 103, or if the circuit output 111 is coupled with a capacitor 131, or a device that has a capacitance represented by capacitor 131, such an operating voltage introduced by the interfacing device or capacitive load introduced by the capacitor 131 could adversely affect the voltage of the output signal 127, which in turn could damage, or degrade the performance of, transistors 103.

In a transmit mode, if the output signal 127 has a voltage that is above a predetermined threshold, or external capacitive loading causes the transistors 103 to be subjected to an excessive voltage that potentially affects the performance of transistors 103, the bias generator 113 supplies the third delayed signal 129 at a voltage level to bias the gates of transistors 103c and 103d. To protect the transistors 103 from damage caused by the potentially excessive voltage levels, the bias generator 113 adjusts the third delayed signal 129 to maintain the absolute value |ΔV| of the difference ΔV between the voltage level at the gates of transistors 103c and 103d and the voltage level at the drains of transistors 103c and 103d at a value that is less than or equal to the third voltage 1X. Keeping the absolute value |ΔV| at a value that is less than or equal to the third voltage 1X protects the transistors 103 from excess voltage levels that results from interfacing devices and/or external capacitance loading.

In some embodiments, the capacitor 131 represents a capacitance loading that results from environmental or other external factors that could cause a capacitance load and affect the voltage levels at the transistors 103. Because the bias generator 113 adjusts the voltage level at the gates of transistors 103c and 103d based on the voltage level at the drains of transistors 103c and 103d, the bias generator provides protection for the transistors 103 over a range of capacitance loads and interfacing device operating voltages. In some embodiments, the bias generator 113 is capable of providing real-time adjustment of the third delayed signal 129, because the bias generator is coupled along the feedback path and bases the voltage difference on the output signal 127.

Figure 2:
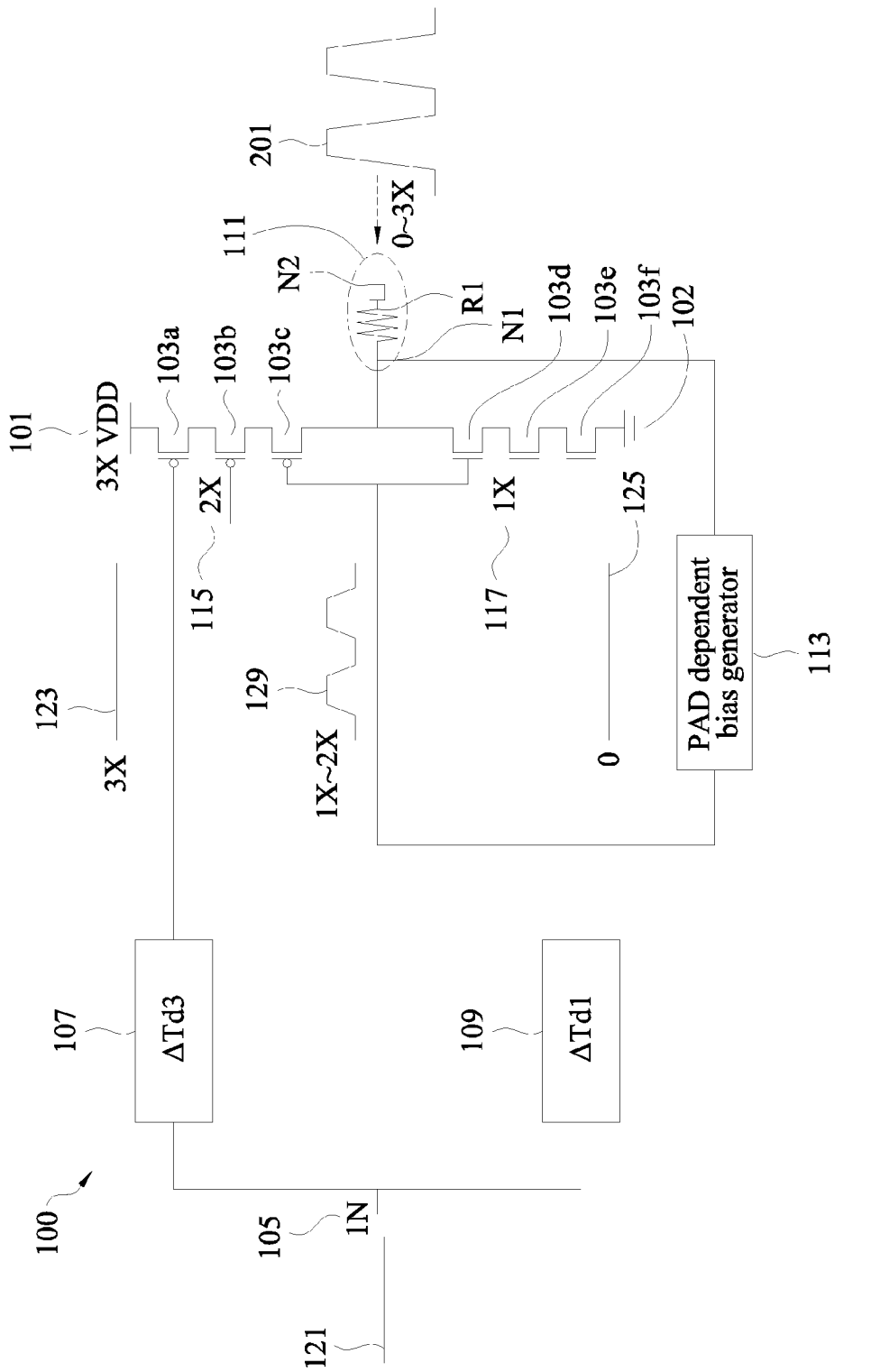
FIG. 2 is a schematic diagram of the driver circuit in a receiving input data mode, in accordance with one or more embodiments.

FIG. 2 is a schematic diagram of the driver circuit 100 in a receiving input data mode, in accordance with one or more embodiments. In the receiving input data mode, the circuit output 111 is configured to receive an input data signal 201 that has a voltage ranges from 0 to the first voltage 3X. In the receiving input data mode, the input signal 121 is flat-lined at the ground voltage level, because there is no data being received by the circuit input 105. In the receiving data mode, bias generator 113 is accordingly configured to adjust third delayed signal 129 to maintain the absolute value |ΔV| of the difference ΔV between the voltage level at the gates of transistors 103c and 103d and the voltage level at the drains of transistors 103c and 103d to be less than or equal to the third voltage 1X to protect the transistors 103 from excessive voltages introduced to the circuit 100 by input signal 201.

Figure 3:
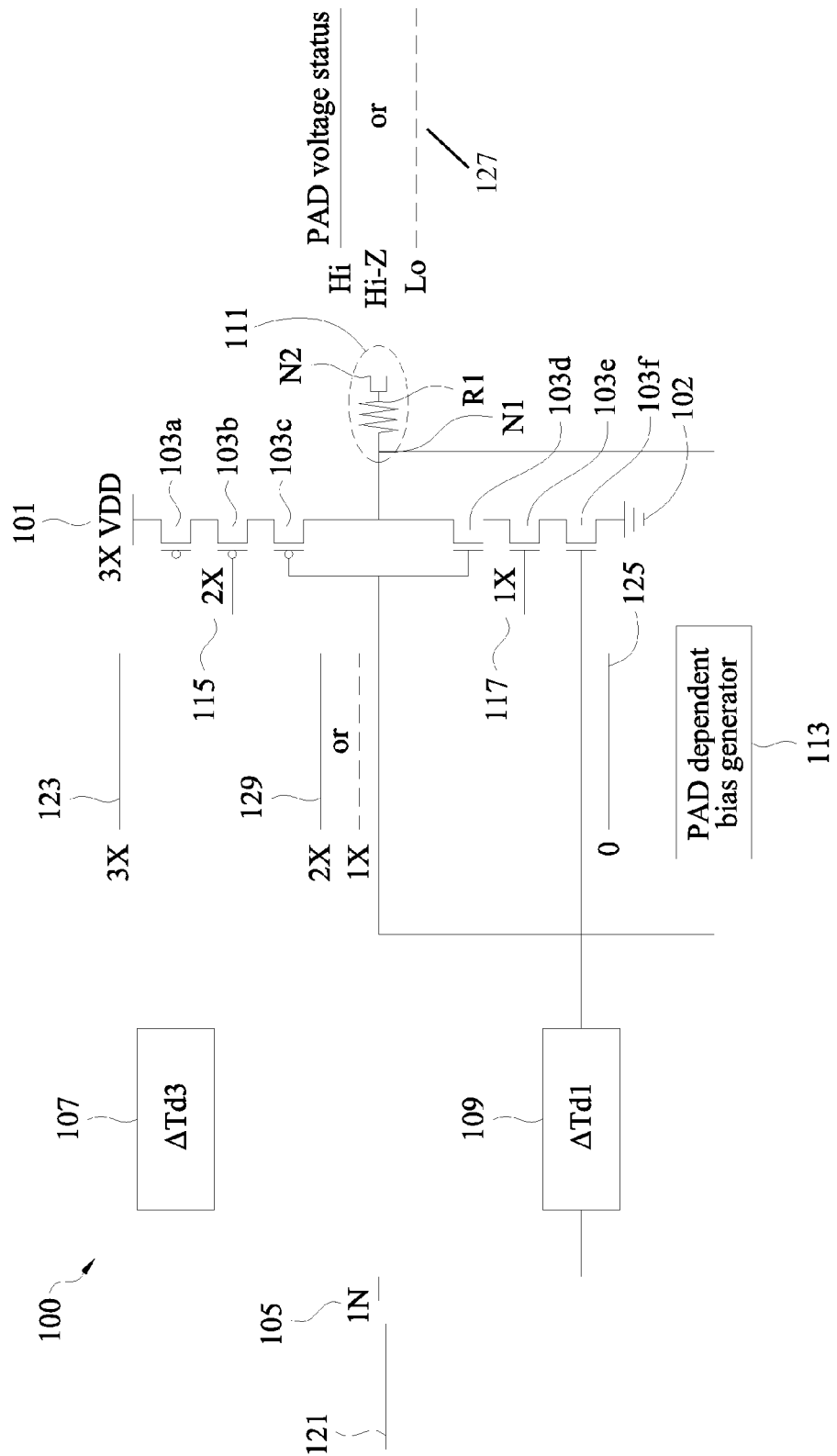
FIG. 3 is a schematic diagram of the driver circuit in power-down mode, in accordance with one or more embodiments.

FIG. 3 is a schematic diagram of the driver circuit 100 in power-down mode, in accordance with one or more embodiments. In the power-down mode, the circuit output 111 is at a high or a low voltage status. The output signal 127 is flat-lined at the ground voltage level or another voltage level greater than the ground voltage level, because the circuit 100 is not transmitting data. In the power-down mode, the input signal 121 is flat-lined at the ground voltage level, because there is no data being received by the circuit input 105. In the power-down mode, bias generator 113 is configured to adjust third delayed signal 129 to maintain the absolute value |ΔV| of the difference ΔV between the voltage level at the gates of transistors 103c and 103d and the voltage level at the drains of transistors 103c and 103d to be less than or equal to the third voltage 1X to protect the transistors 103 from a capacitive loading or other feedback that could cause the voltage tolerance of the transistors 103 to be exceeded.

Figure 4:
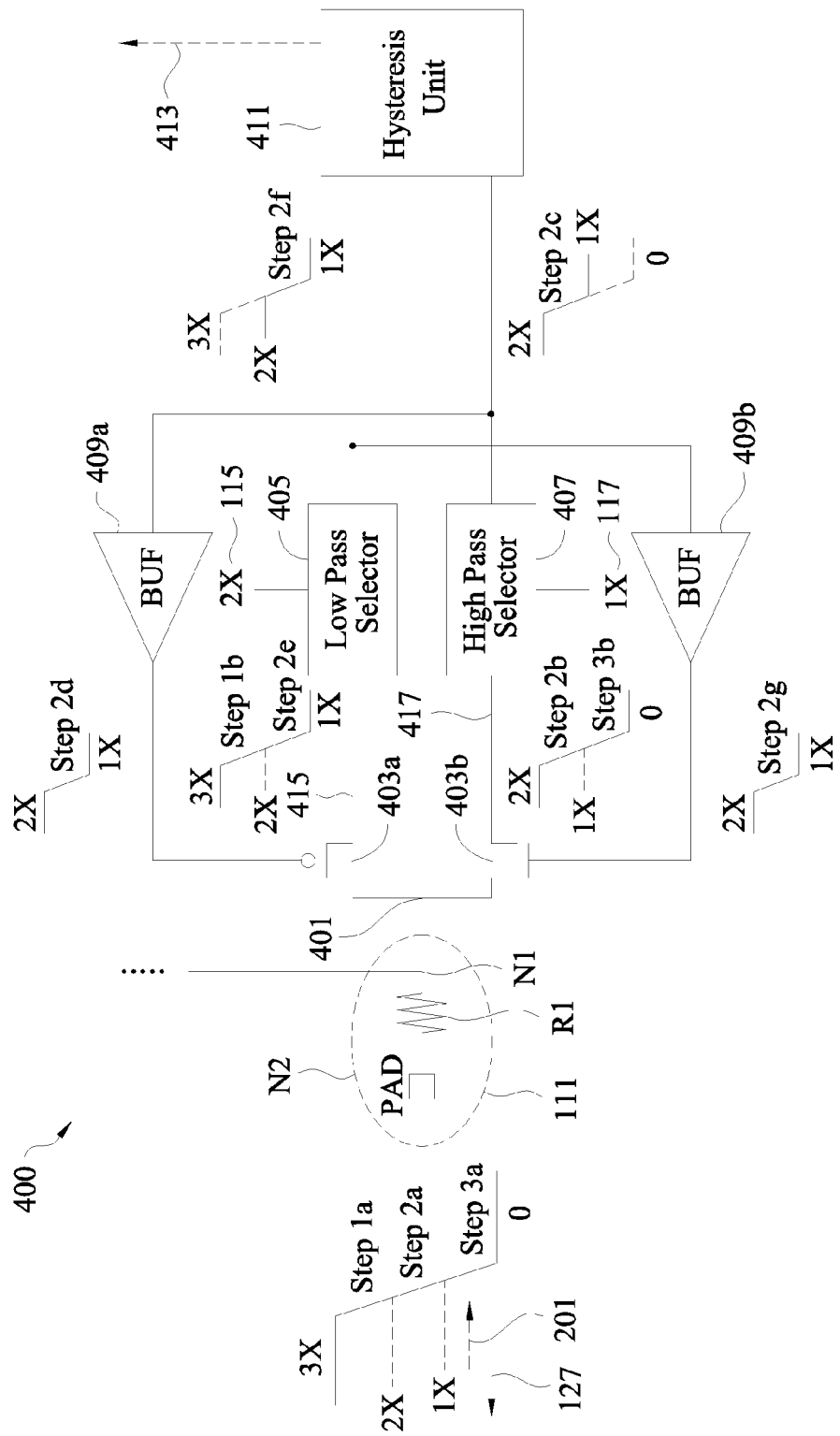
FIG. 4 is a schematic diagram of an example bias generator in use to process a falling edge of a received signal, in accordance with one or more embodiments.

FIG. 4 is a schematic diagram of an example bias generator 400 in use to process a falling edge of a received signal, in accordance with one or more embodiments. In some embodiments, bias generator 400 is usable as bias generator 113 (FIG. 1). Bias generator 400 comprises a bias generator input 401 coupled with transistors 403a and 403b (collectively referred to as transistors 403). Transistors 403 each have a source, a drain, and a gate. Bias generator 400 also comprises a low pass selector 405 and a high pass selector 407 coupled with the transistors 403. Bias generator 400 further comprises buffers 409a and 409b coupled with the low pass selector 405 and the high pass selector 407, as well as the transistors 401. Bias generator 400 additionally comprises a hysteresis unit 411 coupled with the low pass selector 405 and the high pass selector 407. In some embodiments, the hysteresis unit is a Schmitt trigger & level-down unit. Bias generator 400 comprises a bias generator output 413 coupled with the gate of transistor 103c (FIG. 1) and the gate of transistor 103d (FIG. 1).

Bias generator input 401 is coupled with first node N1 of the circuit output 111. Bias generator input 401 receives the output signal 127 in the transmission mode, and input data signal 201 in the receiving input data mode. The source of transistor 403a is coupled with circuit output 111 by way of bias generator input 401. The source of transistor 403b is coupled with the circuit output 111 by way of bias generator input 401. Transistor 403a is a PMOS transistor and transistor 403b is an NMOS transistor. In some embodiments, transistor 403a is an NMOS transistor and transistor 403b in a PMOS transistor. In some embodiments, both transistors 403a and 403b are NMOS transistors. In other embodiments, both transistors 403a and 403b are PMOS transistors.

Low pass selector 405 is coupled with the drain of transistor 403a. Low pass selector is also configured to receive the first bias signal 115 having the second voltage 2X. An output of the low pass selector 405 is coupled with the hysteresis unit 411. High pass selector 407 is coupled with the drain of transistor 403b. High pass selector is also configured to receive the second bias signal 117 having the third voltage 1X. An output of the high pass selector 407 is coupled with the hysteresis unit 411.

An input of buffer 409a is coupled with the output of high pass selector 407 at a node between the output of the high pass selector 407 and the hysteresis unit 411. An output of buffer 409a is coupled with the gate of transistor 403a. An input of buffer 409b is coupled with the output of the low pass selector 405 at a node between the output of the low pass selector 405 and the hysteresis unit 411. An output of buffer 409b is coupled with the gate of transistor 403b.

Bias generator input 401 is split into two separate paths. A first path 415 couples transistor 403a with the low pass selector 405. A second path 417 couples transistor 403b with the high pass selector 407. Each of the first path 415 and the second path 417 have a double voltage swing (e.g., 0~2X after transistor 403b, and 1X~3X after transistor 403a).

The low pass selector 405 is configured to handle a first voltage swing ranging from the third voltage to the first voltage (i.e., from 1X~3X), and the high pass selector 407 is configured to handle a second voltage swing ranging from the ground voltage level to the second voltage (i.e., from 0~2X).

The low pass selector 405 compares the voltage of the signal 127/201 received by way of transistor 403a with the second voltage (e.g., the 2X) to get the 1X~2X voltage swing for the third delayed signal 129 (FIG. 1) output by the bias generator 400 by way of bias generator output 413. The high pass selector 407 compares the voltage of the signal 127/201 received by way of transistor 403b with the third voltage (e.g., the 1X) to get the 1X~2X voltage swing for the third delayed signal 129 output by the bias generator 400 by way of bias generator output 413. In some embodiments, the third delayed signal 129 output by the bias generator 400 protects the transistors 103 (FIG. 1) from a cross intercept signal that could affect the performance of transistors 103 if the cross intercept signal caused the transistors 103 to have a voltage level greater than an allowable threshold voltage.

In use, the received signal 127/201 has a voltage that ranges from 0 to 3X. The received signal 127/201 is broken-up into a low-band (e.g., a band having a voltage range from 0~1X), a mid-band (e.g., a band having a voltage range 1X~2X), and a high-band (e.g., a band having a voltage range 2X~3X). The hysteresis unit 411 processes the mid-band of the received signal 127/201.

In a falling edge sequence, the bias generator 400 processes the received signal 127/201 in a sequence wherein "step 1" refers to the high-band, "step 2" refers to the mid-band, and "step 3" refers to the low-band. As such, the bias generator 400 is configured such that processing of the high-band portion of the received signal 127/201 progresses from step 1a in which the signal 127/201 is received to step 1b in which the received signal 127/201 is compared by the low pass selector 405 to the second voltage 2X, and the portion of the received signal 127/201 determined to have a voltage greater than the second voltage 2X is clamped at voltage 2X such that the portion of the received signal 127/201 having the voltage greater than the second voltage 2X is not output by the low pass selector 405.

Processing of the low-band portion of the received signal 127/201 progresses from step 3a in which the signal 127/201 is received to step 3b in which the received signal 127/201 is compared by the high pass selector 407 to the third voltage 1X, and the portion of the received signal 127/201 determined to have a voltage less than the third voltage 1X is clamped at voltage 1X such that the portion of the received signal 127/201 having the voltage less than the third voltage 1X is not output by the high pass selector 407.

Processing of the mid-band portion of the received signal 127/201 progresses from step 2a in which the signal 127/201 is received to step 2b in which the high pass selector 407 compares the mid-band of the received signal 127/201 to the third voltage 1X. In step 2c, the mid-band of the received signal 127/201 is communicated to and processed by the hysteresis unit 411. The mid-band of the received signal 127/201 is also communicated to buffer 409a, which delays the mid-band of the received signal 127/201 and outputs the delayed signal in step 2d to the gate of transistor 403a as feedback for generating the third delayed signal 129 (FIG. 1).

Processing of the mid-band portion of the received signal 127/201 progresses from step 2a in which the signal 127/201 is received to step 2e in which the low pass selector 405 compares the mid-band of the received signal 127/201 to the second voltage 2X. In step 2f, the mid-band of the received signal 127/201 is communicated to and processed by the hysteresis unit 411. The mid-band of the received signal 127/201 is also communicated to buffer 409b, which delays the mid-band of the received signal 127/201 and outputs the delayed signal in step 2g to the gate of transistor 403b as feedback for generating the third delayed signal 129. In some embodiments, the process continues for each falling edge of the received signal 127/201. The mid-band signals received by the hysteresis unit 411 are processed by the hysteresis unit and output as the third delayed signal 129 to provide protection from a cross intercept signal.

Figure 5:
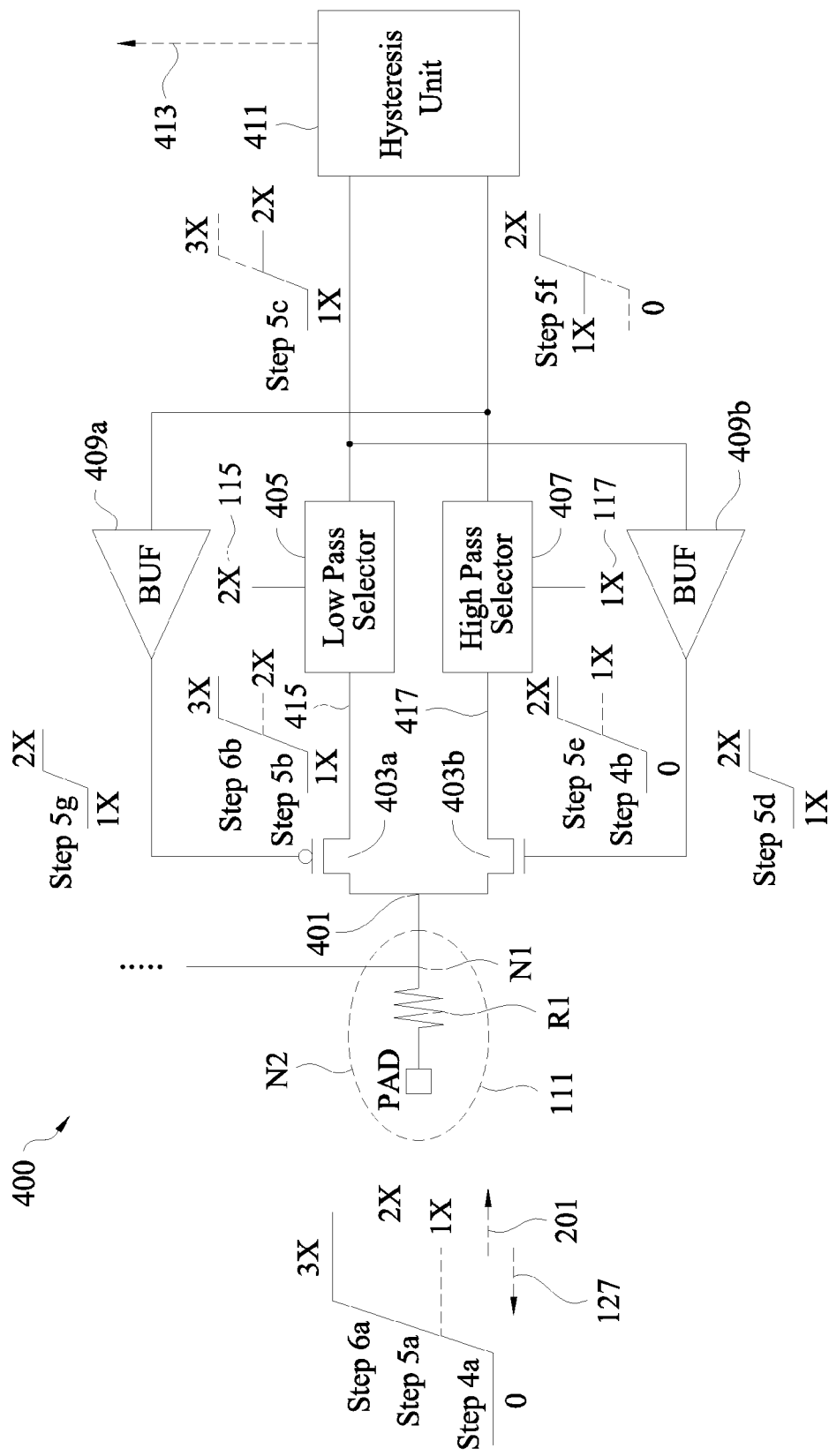
FIG. 5 is a schematic diagram of the example bias generator of FIG. 4 in use to process a rising edge of the received signal, in accordance with one or more embodiments.

FIG. 5 is a schematic diagram of the example bias generator 400 of FIG. 4 in use to process a rising edge of the received signal 127/201, in accordance with one or more embodiments. In a rising edge sequence, the bias generator 400 processes the received signal 127/201 in a sequence wherein "step 6" refers to the high-band, "step 5" refers to the mid-band, and "step 4" refers to the low-band. As such, the bias generator 400 is configured such that processing of the high-band portion of the received signal 127/201 progresses from step 6a in which the signal 127/201 is received to step 6b in which the received signal 127/201 is compared by the low pass selector 405 to the second voltage 2X, and the portion of the received signal 127/201 determined to have a voltage greater than the second voltage 2X is clamped at voltage 2X such that the portion of the received signal 127/201 having the voltage greater than the second voltage 2X is not output by the low pass selector 405.

Processing of the low-band portion of the received signal 127/201 progresses from step 4a in which the signal 127/201 is received to step 4b in which the received signal 127/201 is compared by the high pass selector 407 to the third voltage 1X, and the portion of the received signal 127/201 determined to have a voltage less than the third voltage 1X is clamped at voltage 1X such that the portion of the received signal 127/201 having the voltage less than the third voltage 1X is not output by the high pass selector 407.

Processing of the mid-band portion of the received signal 127/201 progresses from step 5a in which the signal 127/201 is received to step 5b in which the low pass selector 405 compares the mid-band of the received signal 127/201 to the second voltage 2X. In step 5c, the mid-band of the received signal 127/201 is communicated to and processed by the hysteresis unit 411. The mid-band of the received signal 127/201 is also communicated to buffer 409b, which delays the mid-band of the received signal 127/201 and outputs the delayed signal in step 5d to the gate of transistor 403b as feedback for generating the third delayed signal 129 (FIG. 1).

Processing of the mid-band portion of the received signal 127/201 progresses from step 5a in which the signal 127/201 is received to step 5e in which the high pass selector 407 compares the mid-band of the received signal 127/201 to the third voltage 1X. In step 5f, the mid-band of the received signal 127/201 is communicated to and processed by the hysteresis unit 411. The mid-band of the received signal 127/201 is also communicated to buffer 409a, which delays the mid-band of the received signal 127/201 and outputs the delayed signal in step 5g to the gate of transistor 403a as feedback for generating the third delayed signal 129. In some embodiments, the process continues for each rising edge of the received signal 127/201. The mid-band signals received by the hysteresis unit 411 are processed by the hysteresis unit and output as the third delayed signal 129 to provide protection from a cross intercept signal.

Figure 6:
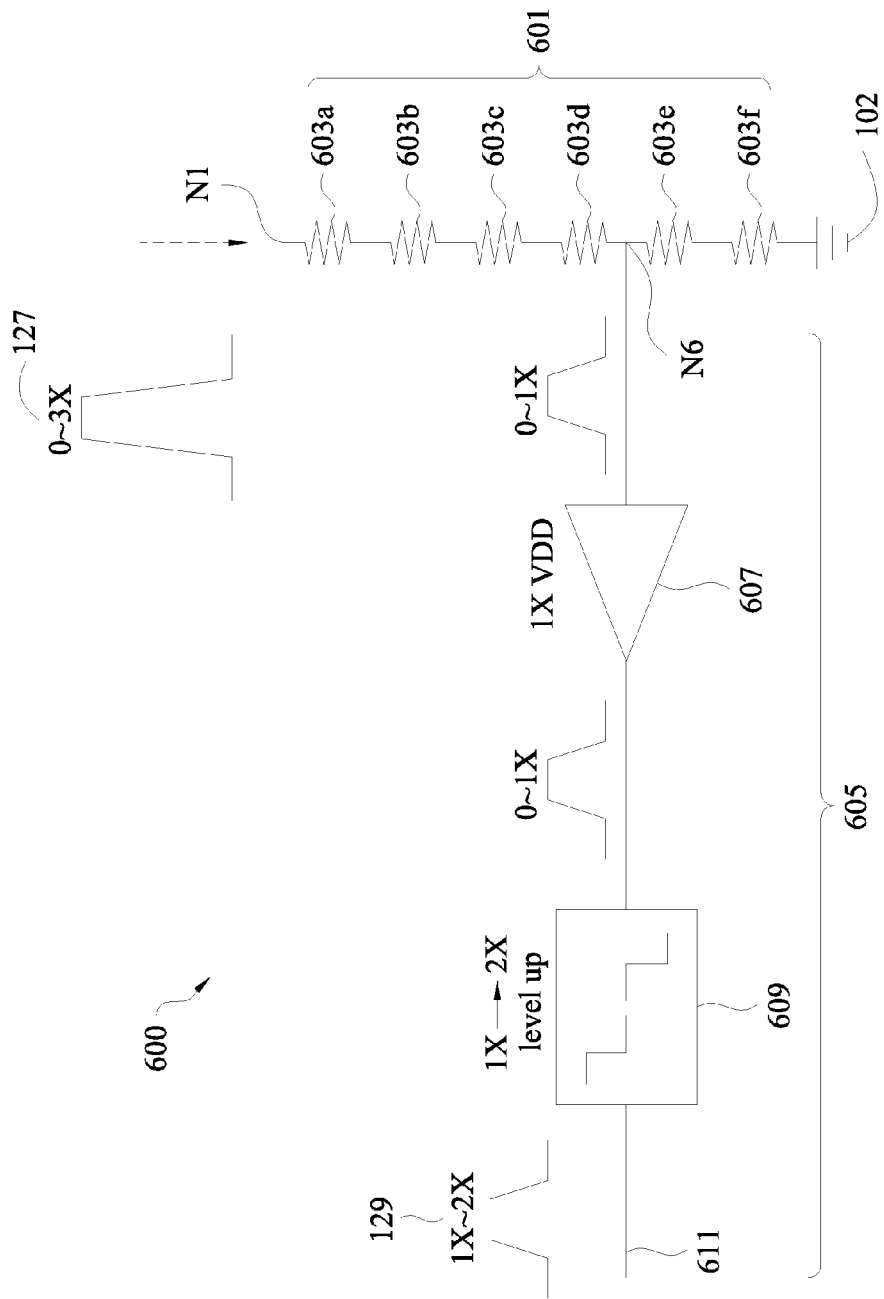
FIG. 6 is a schematic diagram of another example bias generator, in accordance with one or more embodiments.

FIG. 6 is a schematic diagram of another example bias generator 600, in accordance with one or more embodiments. In some embodiments, bias generator 600 is usable as bias generator 113 (FIG. 1). Bias generator 600 comprises a resistor ladder 601 comprising a plurality of resistors 603a-603f coupled in series between first node N1 of the circuit output 111 and the reference voltage node 102. A feedback path 605 is coupled with the resistor ladder 601 at a node N6 between a first third of the resistors 603 of the plurality of resistors and a second third of the resistors 603 of the plurality of resistors 603. The first third of the resistors 603 of the plurality of resistors 603 is closer to the reference voltage node 102 than the second third of the resistors 603 of the plurality of resistors 603. For example, the first third of the resistors 603 of the plurality of resistors 603 includes resistor 603e and resistor 603f; the second third of the resistors 603 of the plurality of resistors 603 includes resistor 603c and resistor 603d. The resistor ladder 601 is configured to monitor the difference ΔV between the voltage level at the gates of transistors 103c and 103d and the voltage level at the drains of transistors 103c and 103d based on a total resistance of the resistors 603 of the plurality of resistors 603 between the circuit output 111 and the node at which the feedback path 605 is coupled with the resistor ladder 601 for a voltage difference ΔV less than or equal to the third voltage 1X. At the first third of the resistors 603 of the plurality of resistors 603, the maximum voltage is the third voltage 1X.

The feedback path 605 comprises a buffer 607 coupled with a level shifter 609. The feedback path 605 further comprises a bias generator output 611 from which the third delayed signal 129 is output.

Figure 7:
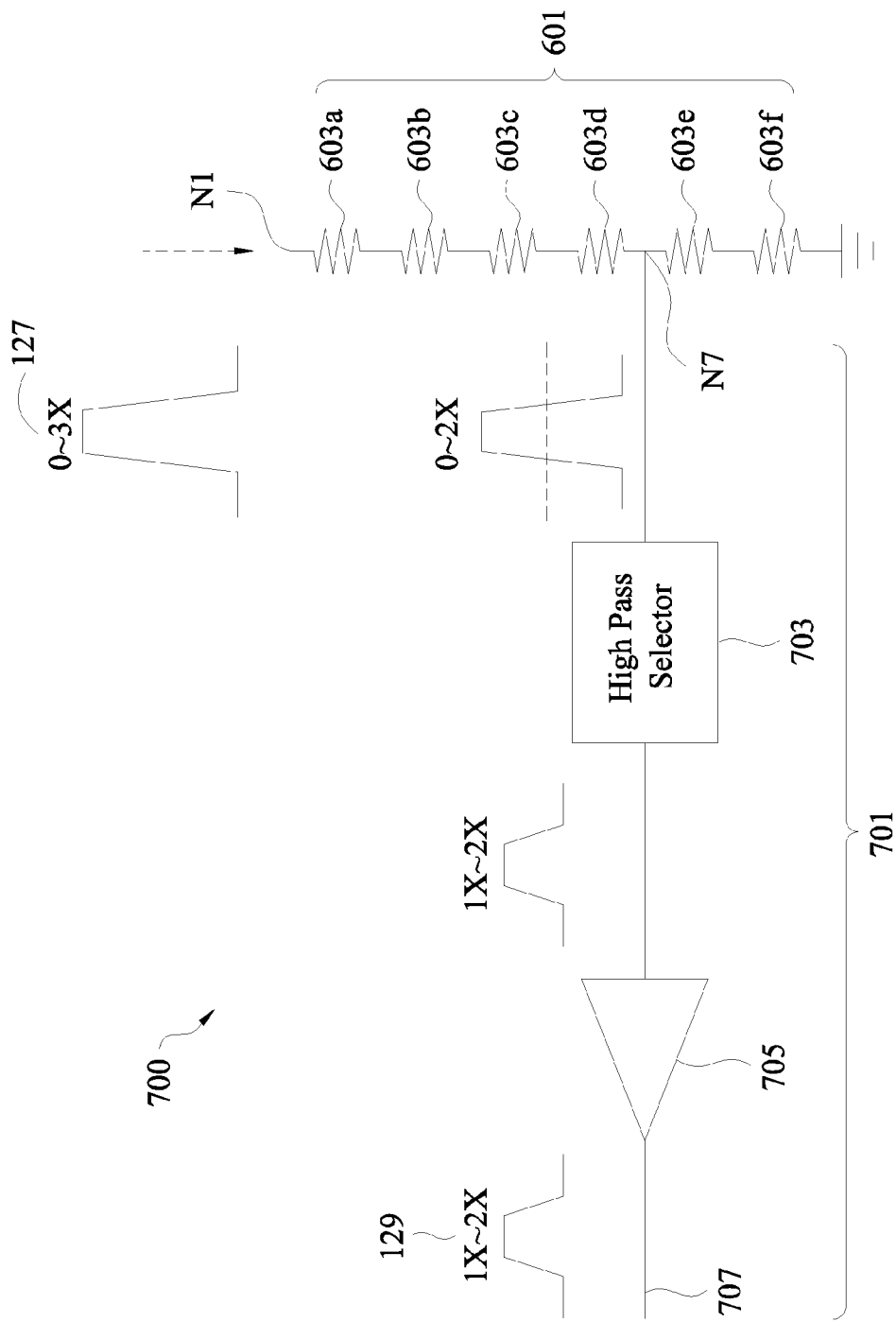
FIG. 7 is a schematic diagram of another example bias generator, in accordance with one or more embodiments.

FIG. 7 is a schematic diagram of another example bias generator 700, in accordance with one or more embodiments. In some embodiments, bias generator 700 is usable as bias generator 113 (FIG. 1). Bias generator 700 comprises the resistor ladder 601, which has the plurality of resistors 603a-603f coupled in series between first node N1 of the circuit output 111 and the reference voltage node 102. A feedback path 701 is coupled with the resistor ladder 601 at a node between a first third of the resistors 603 of the plurality of resistors and a second third of the resistors 603 of the plurality of resistors 603. The first third of the resistors 603 of the plurality of resistors 603 is closer to the circuit output 111 than the second third of the resistors 603 of the plurality of resistors 603. For example, the first third of the resistors 603 of the plurality of resistors 603 includes resistor 603a and resistor 603b, the second third of the resistors 603 of the plurality of resistors 603 includes resistor 603c and resistor 603d. The resistor ladder 601 is configured to monitor the difference ΔV between the voltage level at the gates of transistors 103c and 103d and the voltage level at the drains of transistors 103c and 103d based on a total resistance of the resistors 603 of the plurality of resistors 603 between the circuit output 111 and the node at which the feedback path 605 is coupled with the resistor ladder 601 for a voltage difference ΔV less than or equal to the third voltage 1X. At the first third of the resistors 603 of the plurality of resistors 603, the maximum voltage is the second voltage 2X.

The feedback path 701 comprises a high path selector 703 coupled with a buffer 705. The high pass selector 703 is configured to compare the voltage of the output signal 127 with the third voltage 1X, and to output a mid-band of the signal having a voltage swing ranging from the third voltage 1X and the second voltage 2X to the buffer 705. The buffer 705 delays the signal received from the high pass selector 703 to generate the third delayed signal 129. The feedback path 701 further comprises a bias generator output 707 from which the third delayed signal 129 is output.

Because the feedback path 701 is coupled with the resistor ladder 601 at a node closer to the circuit output 111 than the feedback path 605 (FIG. 6), a bias generator 113 having the configuration discussed with respect to FIG. 7 has a shorter response time than a bias generator 113 having the configuration discussed with respect to FIG. 6.

Figure 8:
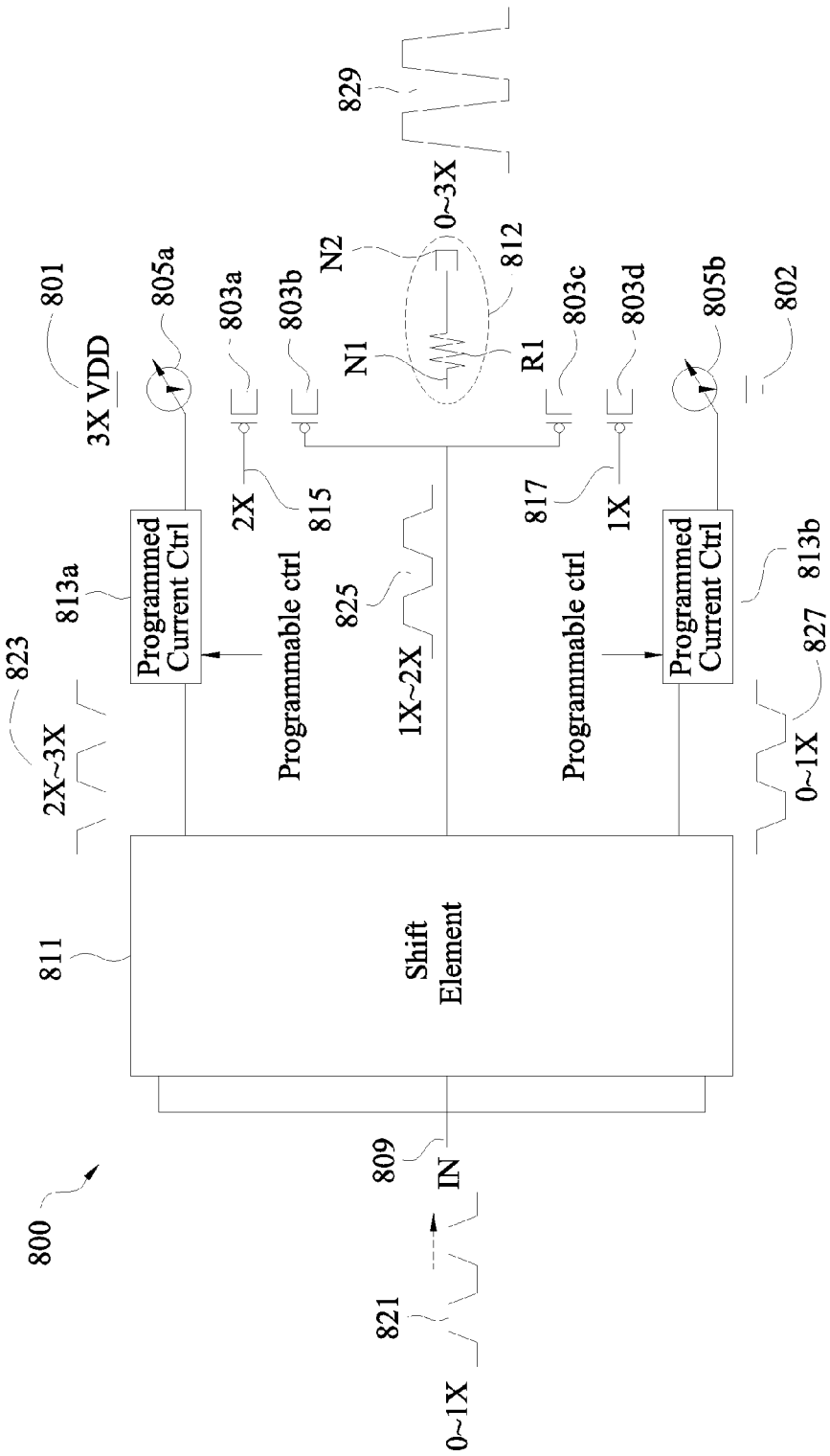
FIG. 8 is a schematic diagram of a driver circuit, in accordance with one or more embodiments.

FIG. 8 is a schematic diagram of a driver circuit 800, in accordance with one or more embodiments. Circuit 800 provides a triple voltage boost circuit on a signal driver that includes electrical performance and device protection from the hot carrier injection effect.

Circuit 800 comprises a voltage supply node 801, a reference voltage node 802, and a plurality of transistors 803a-803d (collectively referred to as transistors 803) coupled between the voltage supply node 801 and reference voltage node 802. Transistors 803a and 803b are PMOS transistors, and transistors 803c and 803d are NMOS transistors. In some embodiments, the transistors 803 comprise a different combination or arrangement of PMOS and/or NMOS transistors. Transistors 803 each comprise a source, a drain, and a gate.

Circuit 800 also comprises a current mirror 805a coupled with the voltage supply and transistor 803a, and a current mirror 805b coupled with transistor 803d. Current mirrors 805a and 805b each comprise a power node, a set of control nodes, and an output. Circuit 800 further comprises a circuit input 809, a shift element 811, a current controller 813a and a current controller 813b. The shift element 811 is coupled with the circuit input 809, transistor 803b, transistor 803c, current controller 813a, and current controller 813b. Circuit 800 additionally comprises a circuit output 812 coupled with transistor 803b and transistor 803c.

The reference voltage node 802 is configured to carry a reference voltage recognizable in circuit 800 as 0 volts or ground voltage level. The voltage supply node 801 is configured to carry a first voltage 3X, where X=n volts (V) (e.g., if X is 1V, then the first voltage is 3V). The power node of current mirror 805a is coupled with voltage supply node 801. The source of transistor 803a is coupled with the output of current mirror 805a. The gate of transistor 803a is configured to receive a first bias signal 815. The first bias signal 815 has a second voltage 2X that is less than the first voltage 3X. The source of transistor 803b is coupled with the drain of transistor 803a. The drain of transistor 803c is coupled with the drain of transistor 803b. The drain of transistor 803d is coupled with the source of transistor 803c. The gate of transistor 803d is configured to receive a second bias signal 817. The second bias signal 817 has a third voltage 1X that is less than the second voltage 2X. The second voltage 2X and the third voltage 1X voltage values regardless the voltage level at circuit input 809. In some embodiments, the second voltage 2X and the third voltage 1X are fixed. The output of current mirror 805b is coupled with the source of transistor 803d. The power node of current mirror 805b is coupled with reference voltage node 802.

Circuit input 809 is configured to receive an input signal 821. In some embodiments, a controller (not shown) supplies the input signal 821, the first bias signal 815 and the second bias signal 817. The input signal 821 has a fourth voltage that is less than or equal to the third voltage 1X. Based on a logic condition of the input signal 821, the voltage of the input signal 821 has a voltage swing ranging from the ground voltage level to the third voltage, or, in other words, a voltage swing that ranges from 0 to 1X. Input signal 821 comprises data for the circuit 800 to drive out in a transmission mode.

Shift element 811 is coupled with current mirror 805a along a first path, the gate of transistor 803b and the gate of transistor 803c along a second path, and current mirror 805b along a third path. Shift element 811 is configured to receive the input signal 821 and to (1) output a first delayed signal 823 having a fifth voltage greater than or equal to the second voltage 2X and less than or equal to the first voltage 3X to the first path, (2) output a second delayed signal 825 having a sixth voltage greater than or equal to the third voltage 1X and less than or equal to the second voltage 2X to the second path, and (3) output a third delayed signal 827 having a seventh voltage less than or equal to the third voltage 1X to the third path.

Based on a logic condition of the first delayed signal 823, the first delayed signal 823 has a voltage swing ranging from the second voltage to the first voltage, or, in other words, a voltage swing that ranges from 2X to 3X. In some embodiments, shift element 811 generates the first delayed signal 823 by adding the fourth voltage of the input signal 821 to the second voltage 2X. The first delayed signal 823 is out of phase with the input signal 821, as caused by the shift element 811. In some embodiments, the first delayed signal 823 is out of phase with the input signal 821 by a predetermined amount. In some embodiments, if the first delayed signal 823 is 180 degrees out of phase, and if the input signal 821 is at a logic high, then the first delayed signal 823 is at a logic low.

Based on a logic condition of the second delayed signal 825, the second delayed signal 825 has a voltage swing ranging from the third voltage to the second voltage, or, in other words, a voltage swing that ranges from 1X to 2X. In some embodiments, shift element 811 generates the second delayed signal 825 by adding the input signal 821 to the third voltage 1X. The second delayed signal 825 is out of phase with the input signal 821, as caused by the shift element 811. In some embodiments, the second delayed signal 825 is out of phase with the input signal 821 by a predetermined amount. In some embodiments, if the second delayed signal 825 is 180 degrees out of phase, and if the input signal 821 is at a logic high, then the second delayed signal 825 is at a logic low. In some embodiments, the second delayed signal 825 is in-phase with the input signal 821.

Based on a logic condition of the third delayed signal 827, the third delayed signal 827 has a voltage swing ranging from the ground voltage level voltage to the third voltage, or, in other words, a voltage swing that ranges from 0 to 1X. The third delayed signal 827 is out of phase with the input signal 821, as caused by the shift element 811. In some embodiments, the third delayed signal 827 is out of phase with the input signal 821 by a predetermined amount. In some embodiments, if the third delayed signal 827 is 180 degrees out of phase, and if the input signal 821 is at a logic high, then the third delayed signal 827 is at a logic low. In some embodiments, the first delayed signal 823 and the third delayed signal 827 are out of phase with respect to the input signal 821 by an equal amount. In some embodiments, the first delayed signal 823 and the third delayed signal 827 are out of phase with respect to one another. In some embodiments, the third delayed signal 827 is in-phase with the input signal 821.

Current controller 813a is coupled between the shift element 811 and the current mirror 805a in the first path. Current controller 813a is configured to selectively activate current mirror 805a. Current controller 813b is coupled between the shift element 811 and current mirror 805b in the third path. Current controller 813b is configured to selectively activate current mirror 805b. Current controllers 813a and 813b are coupled with the controller to receive operating instructions or programming instructions to selectively activate the current mirrors 805a and 805b.

Circuit output 812 is coupled with the drain of transistor 803b and the drain of transistor 803c. In a mode, an output signal 829 is driven out by the circuit 800 at the circuit output 812. The output signal 829 has a voltage that ranges from 0 to the first voltage 3X. Circuit output 812 comprises a first node N1, a resistor R1, and a second node N2 coupled in series. The second node N2 is an output pad. In some embodiments, the circuit output 812 excludes the resistor R1.

Activation of one or more of current mirror 805a or current mirror 805b modifies one or more of a pull-up driving strength or a pull-down driving strength of the output signal 829. The pull-up driving strength and the pull-down driving strength of the output signal 829 affect the voltage of the output signal 829.

Experimental results have demonstrated that selective operation of the current mirrors 805a and 805b is successful in protecting the transistors 803 from excessive voltage loading condition by maintaining, for example, the voltage differences between the seventh voltage and the voltage level at the source of one or more of transistors 803b and 803c within a predetermined range, and the voltage differences between the seventh voltage and the voltage level at the drain of one or more of transistors 803b and 803c within a predetermined range (e.g., first node N1). In some embodiments, the seventh voltage is indicative of a voltage level at the gates of transistors 803b and 803c.

For example, if an absolute value $|\Delta V1|$ of a difference $\Delta V1$ between the voltage level at the gates of transistors 803b and 803c and a voltage at the source of one of transistors 803b or 803a is less than about 0.3X to about 0.4X of the first voltage 3X from voltage supply node 801, then the transistors 803 are protected from the hot carrier injection effect. The experimental results indicated that the circuit 800 successfully maintained this voltage difference by selectively activating the current mirrors 805a and 805b. Also, if an absolute value $|\Delta V2|$ of a difference $\Delta V2$ between the voltage level at the gates of transistors 803b and 803c and a voltage at the drain of one of transistors 803b or 803a is less than about 1.3X of the first voltage 3X from voltage supply node 801, then the transistors 803 are protected from an overstress condition that results from an excessive voltage value at circuit output 812. The experimental results also indicated that the circuit 800 successfully maintained this voltage difference by selectively activating the current mirrors 805a and 805b.

Figure 9:
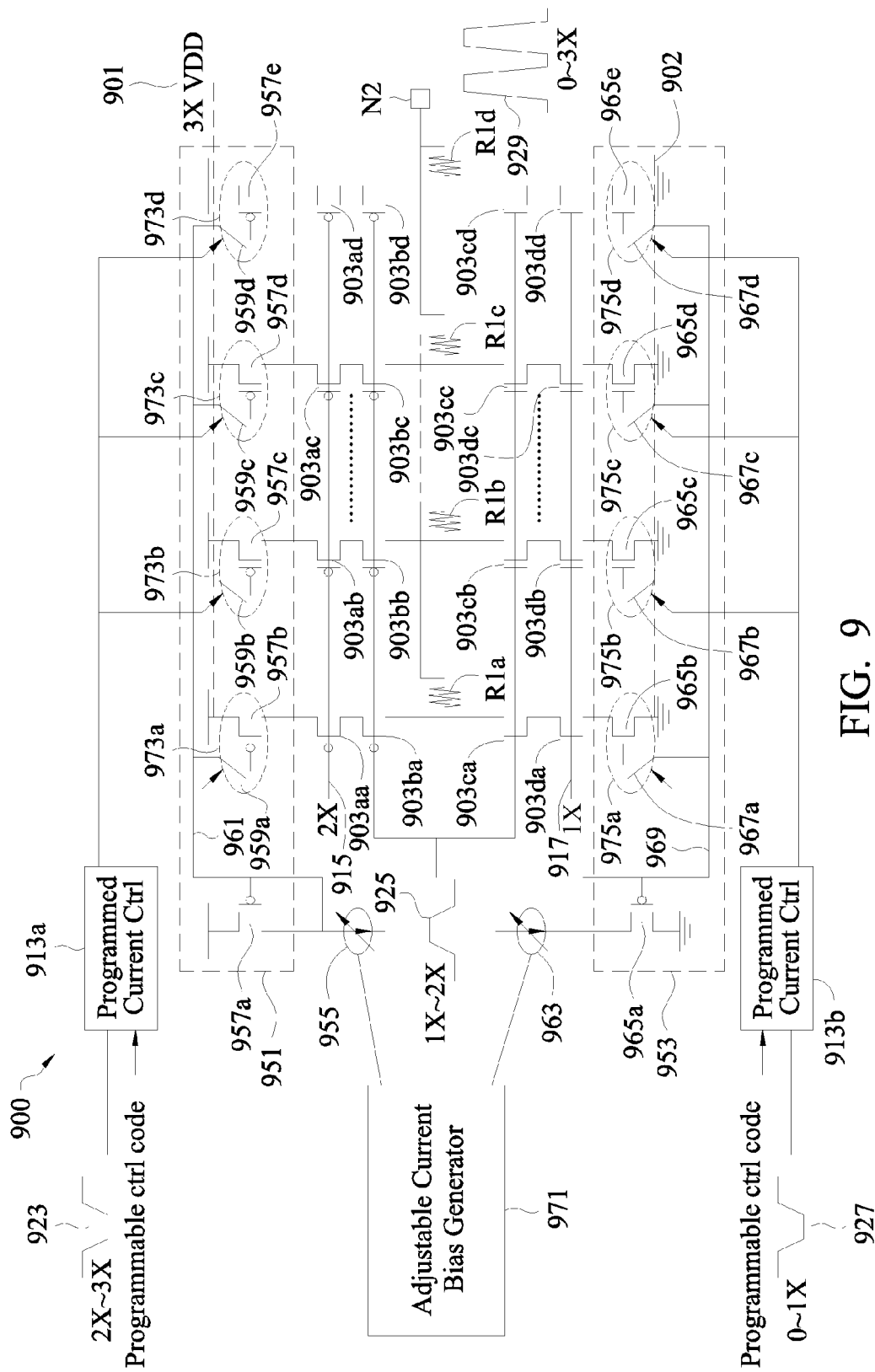
FIG. 9 is a schematic diagram of a portion of a driver circuit, in accordance with one or more embodiments.

FIG. 9 is a schematic diagram of a portion of a driver circuit 900, in accordance with one or more embodiments.

Circuit 900 comprises features similar to those discussed with respect to circuit 800 (FIG. 8), with the reference numerals increased by 100. The portion of circuit 900 is downstream of a circuit input (not shown) and a shift element (not shown) that are similar to the circuit input 809 (FIG. 8) and shift element 811 (FIG. 8). Circuit 900 comprises a current mirror pull-up path 951 and a current mirror pull-down path 953. The current mirror pull-up path 951 includes an adjustable pull-up bias input 955, mirror transistors 957a-957e (collectively referred to as mirror transistors 957), switches 959a-959d, and a pull-up bias line 961. Mirror transistors 957 each have a source, a drain and a gate. Switches 959a-959d are selectively opened and closed to couple the pull-up bias line 961 with the gate of one or more mirror transistors 957b-957e. Switches 959 are coupled with current controller 913a.

The current mirror pull-down path 953 includes an adjustable pull-down bias input 963, mirror transistors 965a-965e (collectively referred to as mirror transistors 965), switches 967a-967d, and a pull-down bias line 969. Mirror transistors 965 each have a source, a drain and a gate. Switches 967a-967d are selectively opened and closed to couple the pull-down bias line 969 with the gate of one or more mirror transistors 965b-965e. Switches 967 are coupled with current controller 913b.

The sources of mirror transistors 957 are coupled with voltage supply node 901. The drains of mirror transistors 957b-957e are coupled with the sources of transistors 903aa-903ad. The sources of mirror transistors 965 are coupled with the reference voltage node 902. The drains of mirror transistors 965b-965e are coupled with the sources of transistors 903da-903dd.

The current mirror pull-up path 951 and the current mirror pull-down path 953 receive pull-up and pull-down currents from an adjustable current bias generator 971. The current controller 913a controls switches 959a-959d to cause a pull-up current supplied by adjustable current bias generator 971 to be selectively mirrored by current mirrors 973a-973d. If one or more of switches 959a-959d are closed, first delayed signal 923 and the pull-up current supplied by the adjustable current bias generator 971 are communicated to the gate of the corresponding one or more of mirror transistors 957b-957d. Current mirrors 973a-973d comprise switches 959a-959d and mirror transistors 957b-957d.

Similarly, the current controller 913b controls switches 967a-967d to cause a pull-down current supplied by adjustable current bias generator 971 to be selectively mirrored by current mirrors 975a-975d. If one or more of switches 967a-967d are closed, third delayed signal 927 and the pull-down current supplied by the adjustable current bias generator 971 are communicated to the gate of the corresponding one or more of mirror transistors 965b-965d. Current mirrors 975a-975d comprise switches 967a-967d and mirror transistors 965b-965d.

The pull-up driving strength or the pull-down driving strength is modified based on one or more of the pull-up current generated by the adjustable current bias generator 971, the pull-down current generated by the adjustable current bias generator 971, the selective opening and closing of the switches 959a-959d, or 967a-967d. The adjustable current bias generator 971 is configured to adjust one or more of the pull-up current or the pull-down current within a predetermined range. The predetermined range for the pull-up current and the pull-down current ranges from a minimum pull-up current $Ibias\_pu_{min}$ to a maximum pull-up current $Ibias\_pu_{max}$, and a minimum pull-down current $Ibias\_pd_{min}$ to a maximum pull-down current $Ibias\_pd_{max}$. The output signal 929, accordingly, has a widened tuning range that is a product of the adjustable current range provided by the adjustable current bias generator 971 and a multiple of activated current mirrors 973a-973d and 975a-975d. For example, a programmed value of n binary bits for a programmed control code supplied by a controller (not shown) indicates that n current mirrors are activated. Pull-up tuning range, therefore, ranges from $Ibias\_pu_{min}$ to a maximum pull-up current $(2^n-1) \times Ibias\_pu_{max}$. Pull-down tuning range, therefore, ranges from $Ibias\_pd_{min}$ to a maximum pull-up current $(2^n-1) \times Ibias\_pd_{max}$. The adjustability of the adjustable current bias generator 971 makes it possible to control the slew rate of the voltage at the circuit output at node N2 without including separate slew rate control elements that could add to the expense and physical size of an integrated circuit.

In some embodiments, the adjustable current bias generator 971 is coupled with controller 913a and current controller 913b, the pull-up current is supplied to one or more of the current mirrors 973a-973d by way of current controller 913a and the pull-down current is supplied to one or more current mirrors 975a-975d by way of current controller 913b. Second delayed signal 925 is supplied to the gates of transistors 903ba-bd and 903ca-cd.

Figure 10:
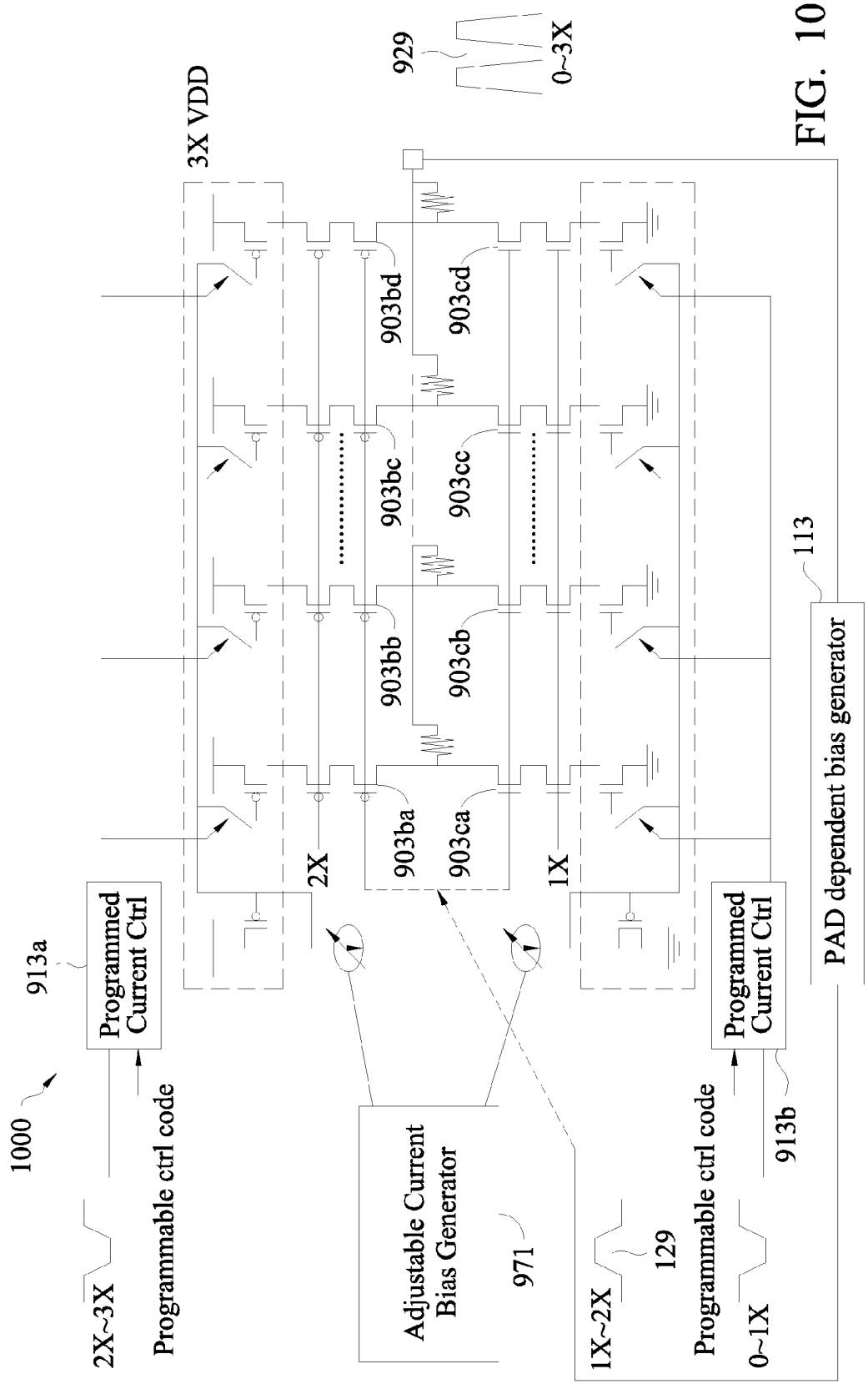
FIG. 10 is a schematic diagram of a driver circuit, in accordance with one or more embodiments.

FIG. 10 is a schematic diagram of a driver circuit 1000, in accordance with one or more embodiments. Circuit 1000 is a combination of circuit 100 and circuit 900. Circuit 1000, accordingly, comprises many of the features discussed with respect to FIGS. 1 and 9. In this example embodiment, circuit 1000 includes the current controllers 913a and 913b of circuit 900 (FIG. 9), adjustable current bias generator 971 of circuit 900, and bias generator 113 of circuit 100 (FIG. 1). Bias generator 113 generates the third delayed signal 129 supplied to transistors 903ba-903bd and 903ca-903cd. Circuit 1000 is capable of providing the benefits of both circuit 100 and circuit 900 in a single driver circuit.

Figure 11:
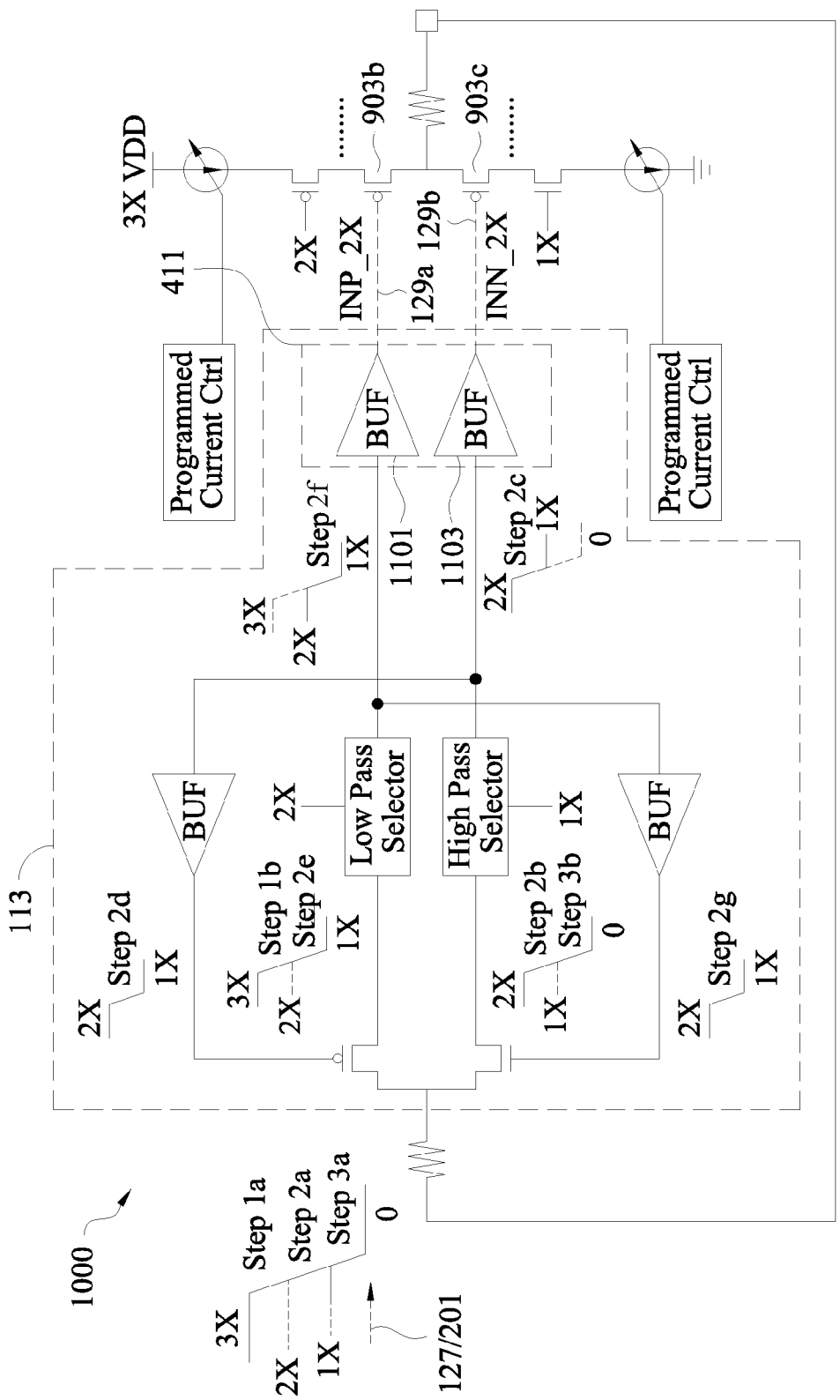
FIG. 11 is a schematic diagram of the driver circuit of FIG. 10 in use to process a falling edge of a received signal, in accordance with one or more embodiments.

FIG. 11 is a schematic diagram of the driver circuit 1000 in use to process a falling edge of a received signal, in accordance with one or more embodiments. The bias generator 113 is similar to the bias generator 400 discussed with respect to FIG. 4. In this example embodiment, the hysteresis unit 411 comprises buffer 1101 and buffer 1103. Buffer 1101 is coupled with the gate of transistor 903b and buffer 1103 is coupled with the gate of transistor 903c. Buffer 1101 is coupled with low pass selector 405 and buffer 1103 is coupled with high pass selector 407. The buffers 1101 and 1103 output separate portions 129a and 129b of third delayed signal 129 to the gates of transistors 903b and 903c. FIG. 11 illustrates an example falling edge sequence associated with input signal 127/201. The falling edge sequence is the same as that discussed with respect to FIG. 4.

Figure 12:
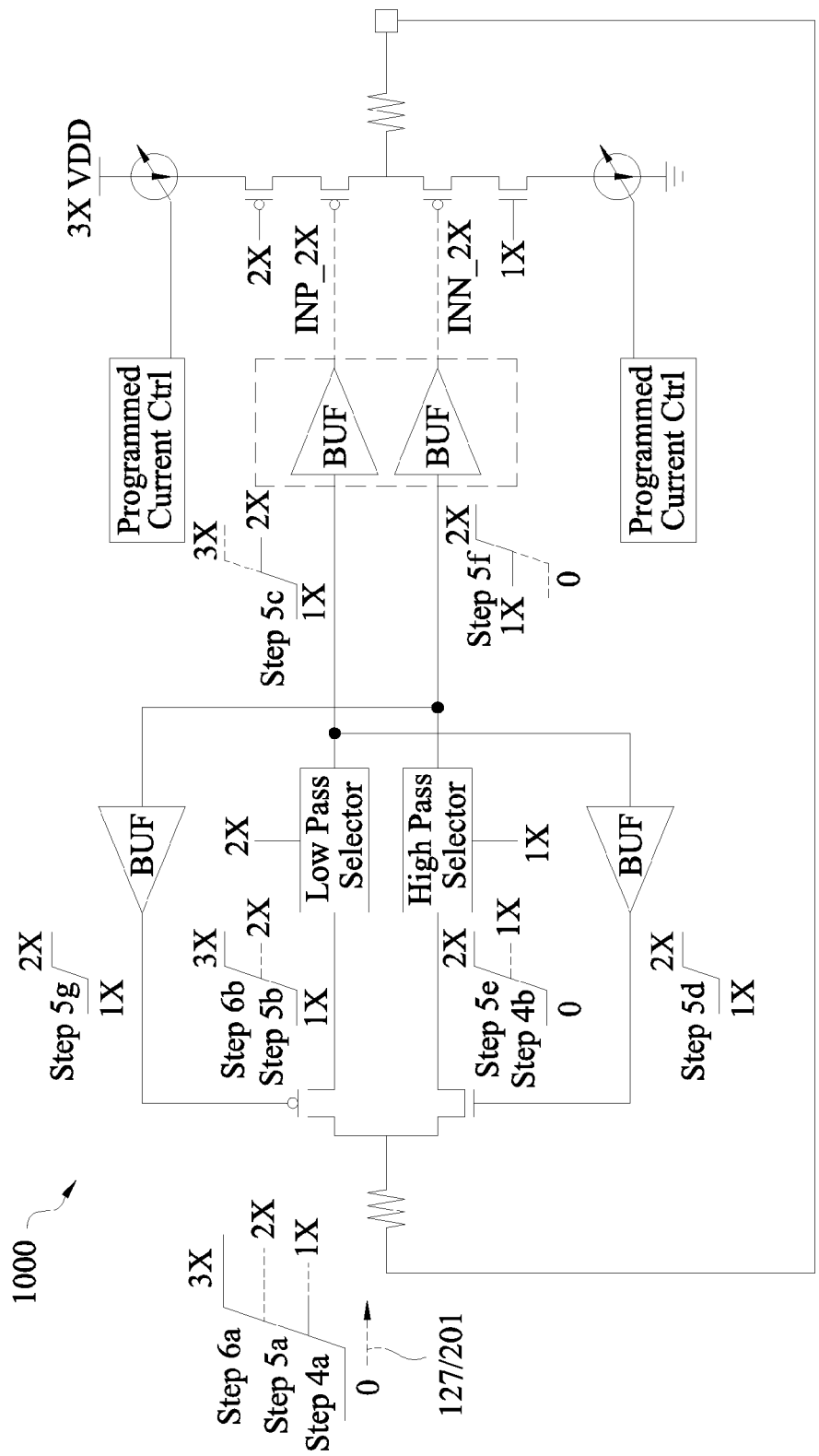
FIG. 12 is a schematic diagram of the driver circuit of FIG. 10 in use to process a rising edge of a received signal, in accordance with one or more embodiments.

FIG. 12 is a schematic diagram of the driver circuit 1000, in accordance with one or more embodiments. FIG. 12 illustrates an example rising edge sequence associated with input signal 127/201. The rising edge sequence is the same as that discussed with respect to FIG. 5.

The processes described herein for supplying an input signal, for providing operating instructions or programming instructions, for generating or adjusting a supplied pull-up or pull-down current, or for generating a delayed signal may be performed via software in combination with hardware or firmware, hardware, firmware or a combination of software and firmware and/or hardware. For example, the processes described herein, may be advantageously implemented via a controller, a processor, Digital Signal Processing (DSP) chip, an Application Specific Integrated Circuit (ASIC), Field Programmable Gate Arrays FPGAs, etc. Such exemplary hardware for performing the described functions is detailed below.

Figure 13:
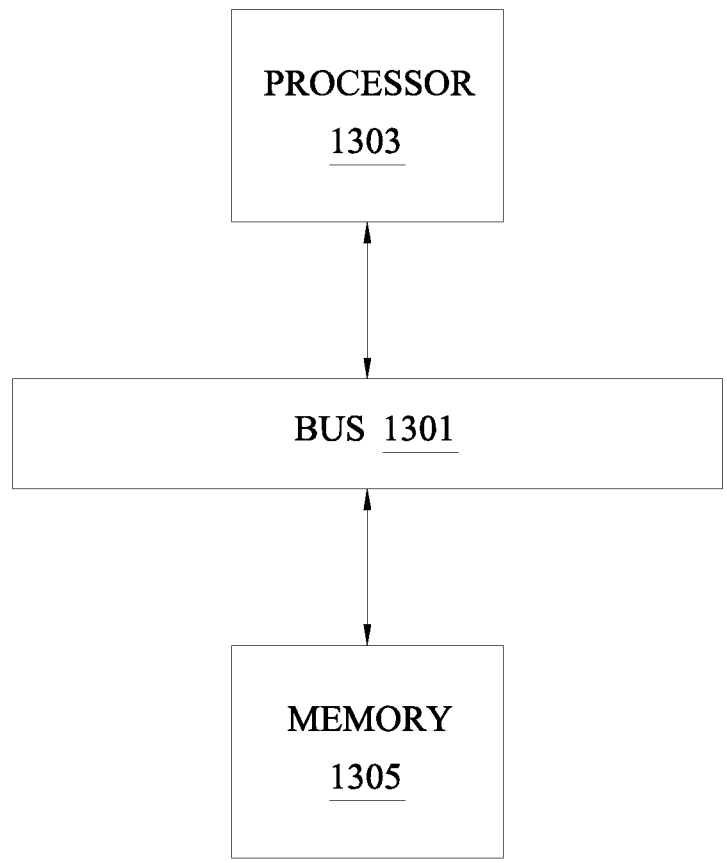
FIG. 13 is a functional block diagram of a computer or processor-based system upon which or by which an embodiment is implemented.

FIG. 13 is a functional block diagram of a computer or processor-based system 1300 upon which or by which an embodiment is implemented.

Processor-based system 1300 is programmed to design a memory circuit, as described herein, and includes, for example, bus 1301, processor 1303, and memory 1305 components.

In some embodiments, the processor-based system is implemented as a single "system on a chip." Processor-based system 1300, or a portion thereof, constitutes a mechanism for designing a memory circuit. In some embodiments, the processor-based system 1300 includes a communication mechanism such as bus 1301 for transferring information and/or instructions among the components of the processor-based system 1300. Processor 1303 is connected to the bus 1301 to obtain instructions for execution and process information stored in, for example, the memory 1305. In some embodiments, the processor 1303 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 1303. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 1303 performs a set of operations on information as specified by a set of instructions stored in memory 1305 related to protecting an integrated circuit from excessive voltages, the hot carrier effect, and/or voltage overstressing. The execution of the instructions causes the processor to perform specified functions.

The processor 1303 and accompanying components are connected to the memory 1305 via the bus 1301. The memory 1305 includes one or more of dynamic memory (e.g., RAM, magnetic disk, writable optical disk, etc.) and static memory (e.g., ROM, CD-ROM, etc.) for storing executable instructions that when executed perform the steps described herein to protect an integrated circuit from excessive voltages, the hot carrier effect, and/or voltage overstressing. The memory 1305 also stores the data associated with or generated by the execution of the steps.

In one or more embodiments, the memory 1305, such as a random access memory (RAM) or any other dynamic storage device, stores information including processor instructions for designing a memory circuit. Dynamic memory allows information stored therein to be changed. RAM allows a unit of information stored at a location called a memory address to be stored and retrieved independently of information at neighboring addresses. The memory 1305 is also used by the processor 1303 to store temporary values during execution of processor instructions. In various embodiments, the memory 1305 is a read only memory (ROM) or any other static storage device coupled to the bus 1301 for storing static information, including instructions, that is not changed. Some memory is composed of volatile storage that loses the information stored thereon when power is lost. In some embodiments, the memory 1305 is a non-volatile (persistent) storage device, such as a magnetic disk, optical disk or flash card, for storing information, including instructions, that persists even when power supplied to the memory 1305 is turned off.

The term "computer-readable medium" as used herein refers to any medium that participates in providing information to processor 1303, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

Figure 14:
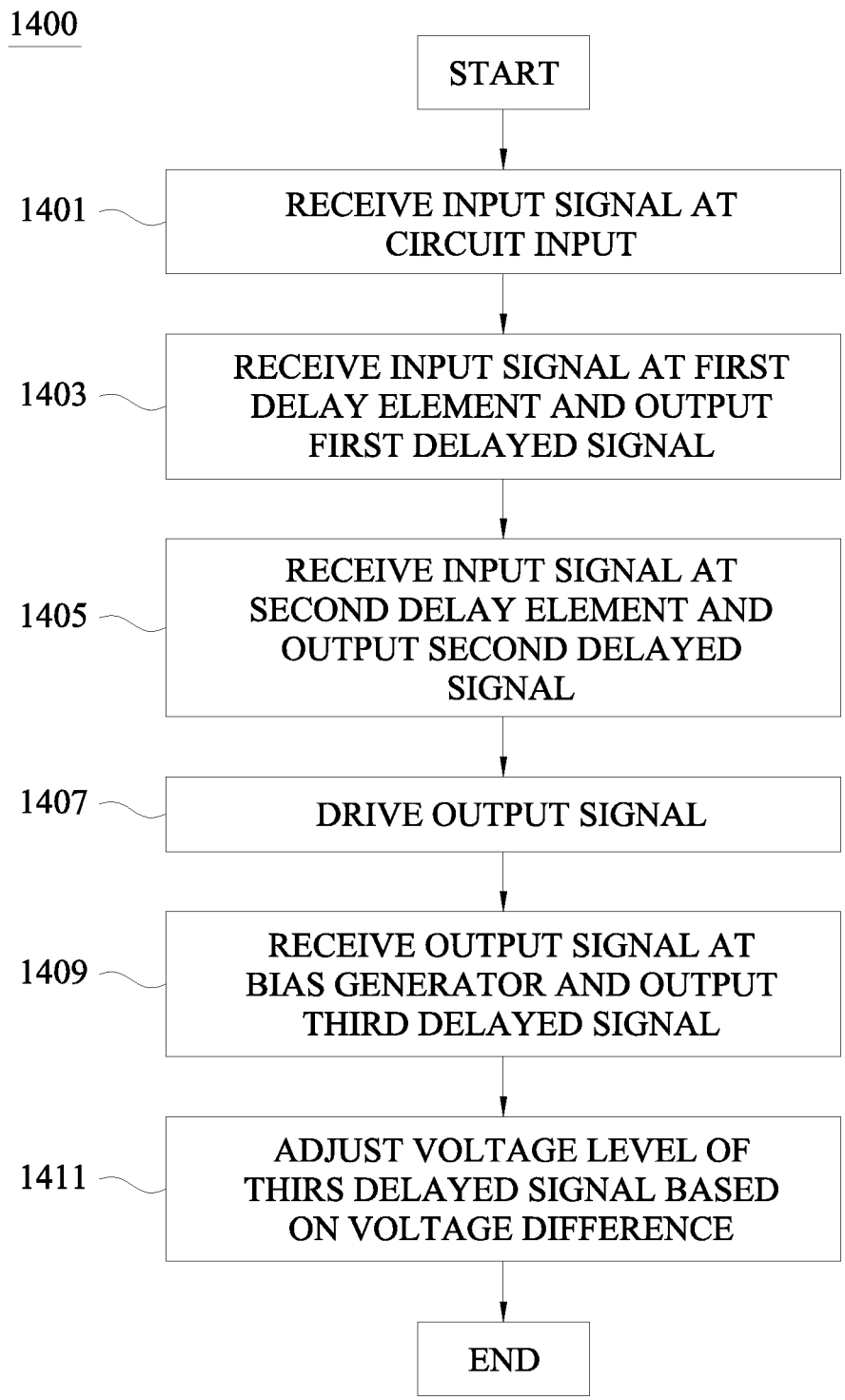
FIG. 14 is a flowchart of a method of providing adaptive bias protection of one or more transistors included in a circuit based on a voltage level of an output signal, in accordance with one or more embodiments.

FIG. 14 is a flowchart of a method 1400 of providing adaptive bias protection of one or more transistors included in a circuit such as circuit 100 (FIG. 1) based on a voltage level of an output signal, in accordance with one or more embodiments.

In step 1401, a circuit input receives an input signal from a controller that comprises a processor and a memory (not shown).

In step 1403, a first delay element receives the input signal from the circuit input and outputs a first delayed signal.

In step 1405, a second delay element receives the input signal from the circuit input and outputs a second delayed signal.

In step 1407, an output signal is driven out by the circuit at a circuit output.

In step 1409, a bias generator receives the output signal and outputs a third delayed signal.

In step 1411, the bias generator adjusts a voltage level of the third delayed signal based on a determined difference $\Delta V$ between two voltage levels at the circuit output to maintain an absolute value $|\Delta V|$ of the difference $\Delta V$ between the two voltage levels at or below a predetermined threshold level.

Figure 15:
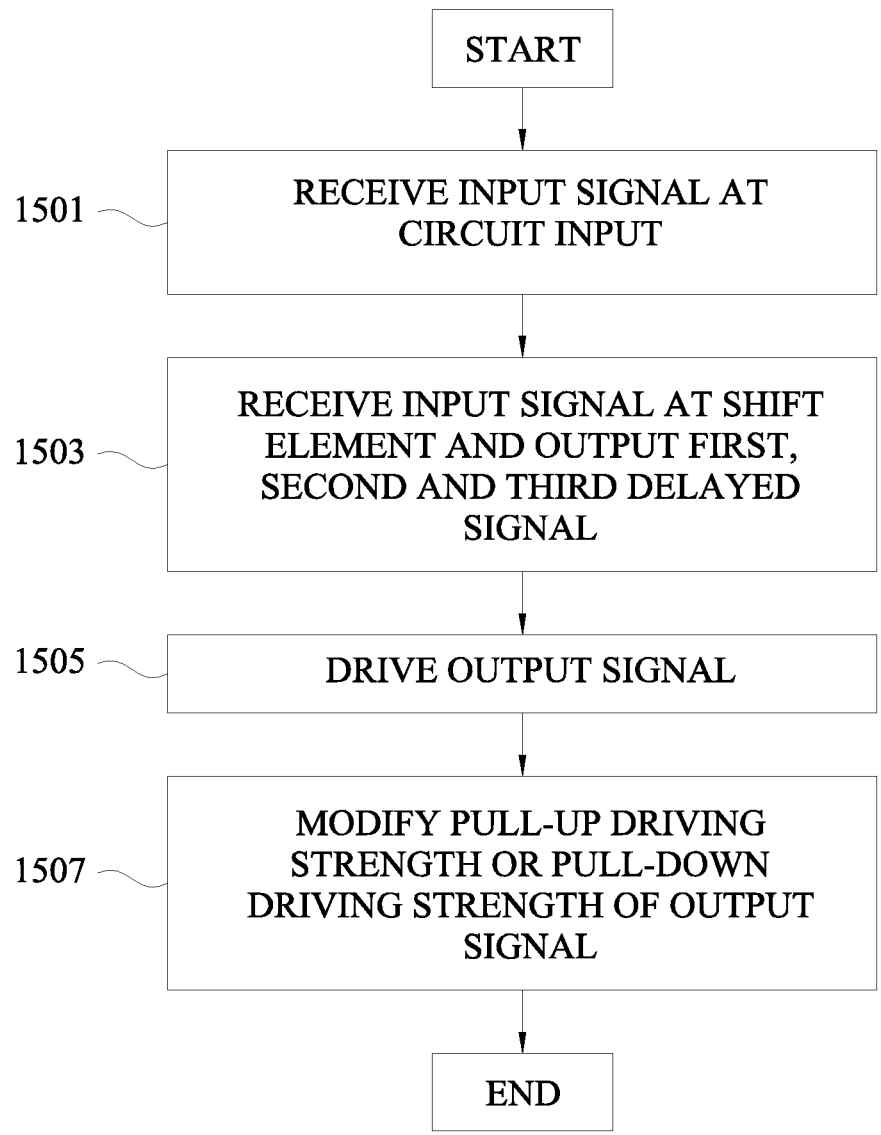
FIG. 15 is a flowchart of a method of providing electrical performance and device protection from the hot carrier injection effect in a circuit, in accordance with one or more embodiments.

FIG. 15 is a flowchart of a method 1500 of providing electrical performance and device protection from the hot carrier injection effect in a circuit such as circuit 800 (FIG. 8), in accordance with one or more embodiments.

In step 1501 a circuit input receives an input signal.

In step 1503, a shift element receives the input signal and outputs a first delayed signal, a second delayed signal, and a third delayed signal.

In step 1505, an output signal is driven out by the circuit at a circuit output.

In step 1507, one or more of a pull-up driving strength or a pull-down driving strength of the output signal is modified. A first current controller and/or a second current controller selectively activates a first current mirror and/or a second current mirror based on received operating instructions or programming instructions to modify the pull-up driving strength and/or the pull-down driving strength of the output signal.

An aspect of this description relates to a driver circuit that comprises a voltage supply node configured to carry a first voltage and a reference voltage node configured to carry a reference ground voltage. The circuit also comprises a first transistor having a source, a drain, and a gate. The source of the first transistor is coupled with the voltage supply node. The circuit further comprises a second transistor having a source, a drain, and a gate. The source of the second transistor is coupled with the drain of the first transistor. The gate of the second transistor is configured to receive a first bias signal having a second voltage less than the first voltage. The circuit additionally comprises a third transistor having a source, a drain, and a gate. The source of the third transistor is coupled with the drain of the second transistor.

The circuit also comprises a fourth transistor having a source, a drain, and a gate. The drain of the fourth transistor is coupled with the drain of the third transistor. The circuit further comprises a fifth transistor having a source, a drain, and a gate. The drain of the fifth transistor is coupled with the source of the fourth transistor. The gate of the fifth transistor is configured to receive a second bias signal having a third voltage less than the second voltage. The circuit additionally comprises a sixth transistor having a source, a drain, and a gate. The drain of the sixth transistor is coupled with the source of the fifth transistor. The source of the sixth transistor is coupled with the voltage reference node.

The circuit also comprises a circuit input configured to receive an input signal having a fourth voltage less than or equal to the third voltage. The circuit further comprises a first delay element coupled with the circuit input and the gate of the first transistor. The first delay element is configured to receive the input signal and to output a first delayed signal having a fifth voltage ranging from the second voltage to the first voltage. The circuit additionally comprises a second delay element coupled with the circuit input and the gate of the sixth transistor. The second delay element is configured to receive the input signal and to output a second delayed signal having a sixth voltage less than or equal to the third voltage.

The circuit also comprises a circuit output coupled with the drain of the third transistor and the drain of the fourth transistor. The circuit further comprises a bias generator having an input and an output. The input of the bias generator is coupled with the circuit output. The output of the bias generator is coupled with the gate of the third transistor and the gate of the fourth transistor. The bias generator is configured to output a third delayed signal having a seventh voltage ranging from the third voltage to the second voltage.

Another aspect of this description relates to a circuit that comprises a voltage supply node configured to carry a first voltage and a reference voltage node configured to carry a reference ground voltage. The circuit also comprises a first current mirror having an input and an output. The input of the current mirror is coupled with the voltage supply. The circuit further comprises a first transistor having a source, a drain, and a gate. The source of the first transistor is coupled with the output of the first current mirror. The gate of the first transistor is configured to receive a first bias signal having a second voltage less than the first voltage. The circuit additionally comprises a second transistor having a source, a drain, and a gate. The source of the second transistor is coupled with the drain of the first transistor.

The circuit also comprises a third transistor having a source, a drain, and a gate. The drain of the third transistor is coupled with the drain of the second transistor. The circuit further comprises a fourth transistor having a source, a drain, and a gate. The drain of the fourth transistor is coupled with the source of the third transistor. The gate of the fourth transistor is configured to receive a second bias signal having a third voltage less than the second voltage. The circuit additionally comprises a second current mirror having an input and an output. The output of the second current mirror is coupled with the source of the fourth transistor. The input of the second current mirror is coupled with the reference voltage node.

The circuit also comprises a circuit input configured to receive an input signal having a fourth voltage less than or equal to the third voltage. The circuit further comprises a shift element coupled with the circuit input, the first current mirror along a first path, the gate of the second transistor and the gate of the third transistor along a second path, and the second current mirror along a third path. The shift element is configured to receive the input signal and to (1) output a first delayed signal having a fifth voltage ranging from the second voltage to the first voltage to the first path, (2) output a second delayed signal having a sixth voltage ranging from the third voltage to the second voltage to the second path, and (3) output a third delayed signal having a seventh voltage less than or equal to the third voltage to the third path. The circuit additionally comprises a first current controller coupled between the shift element and the first current mirror in the first path. The first current controller is configured to selectively activate the first current mirror.

The circuit also comprises a second current controller coupled between the shift element and the second current mirror in the third path. The second current controller is configured to selectively activate the second current mirror. The circuit further comprises a circuit output coupled with the drain of the second transistor and the drain of the third transistor. Activation of one or more of the first current mirror or the second current mirror modifies one or more of a pull-up driving strength or a pull-down driving strength of an output signal transmitted from the circuit output.

A further aspect of this description relates to a circuit that comprises a voltage supply node configured to carry a first voltage and a reference voltage node configured to carry a reference ground voltage. The circuit also comprises a first current mirror having an input and an output. The input of the current mirror is coupled with the voltage supply. The circuit further comprises a first transistor having a source, a drain, and a gate. The source of the first transistor is coupled with the output of the first current mirror. The gate of the first transistor is configured to receive a first bias signal having a second voltage less than the first voltage. The circuit additionally comprises a second transistor having a source, a drain, and a gate. The source of the second transistor is coupled with the drain of the first transistor.

The circuit also comprises a third transistor having a source, a drain, and a gate. The drain of the third transistor is coupled with the drain of the second transistor. The circuit further comprises a fourth transistor having a source, a drain, and a gate; the drain of the fourth transistor is coupled with the source of the third transistor. The gate of the fourth transistor is configured to receive a second bias signal having a third voltage less than the second voltage. The circuit additionally comprises a second current mirror having an input and an output. The output of the second current mirror is coupled with the source of the fourth transistor. The input of the second current mirror is coupled with the voltage reference node.

The circuit also comprises a circuit input configured to receive an input signal having a fourth voltage less than or equal to the third voltage. The circuit further comprises a first delay element coupled with the circuit input and the first current mirror along a first path. The first delay element is configured to receive the input signal and to output a first delayed signal having a fifth voltage ranging from the second voltage to the first voltage. The circuit additionally comprises a second delay element coupled with the circuit input and the second current mirror along a second path. The second delay element is configured to receive the input signal and to output a second delayed signal having a sixth voltage less than or equal to the third voltage.

The circuit also comprises a first current controller coupled between the first delay element and the first current mirror in the first path. The first current controller is configured to selectively activate the first current mirror. The circuit further comprises a second current controller coupled between the shift element and the second current mirror in the second path. The second current controller is configured to selectively activate the second current mirror. The circuit additionally comprises a circuit output coupled with the drain of the second transistor and the drain of the third transistor.

The circuit also comprises a bias generator having an input and an output. The input of the bias generator is coupled with the circuit output. The output of the bias generator is coupled with the gate of the third transistor and the gate of the fourth transistor. The bias generator is configured to output a third delayed signal having a seventh voltage ranging from the third voltage to the second voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A driver circuit, comprising:
a voltage supply node configured to carry a first voltage;
a reference voltage node configured to carry a reference ground voltage;
a first transistor having a source, a drain, and a gate, the source of the first transistor is coupled with the voltage supply node;

a second transistor having a source, a drain, and a gate, the source of the second transistor is coupled with the drain of the first transistor, and the gate of the second transistor is configured to receive a first bias signal having a second voltage less than the first voltage;

a third transistor having a source, a drain, and a gate, the source of the third transistor is coupled with the drain of the second transistor;

a fourth transistor having a source, a drain, and a gate, the drain of the fourth transistor is coupled with the drain of the third transistor;

a fifth transistor having a source, a drain, and a gate, the drain of the fifth transistor is coupled with the source of the fourth transistor, and the gate of the fifth transistor is configured to receive a second bias signal having a third voltage less than the second voltage;

a sixth transistor having a source, a drain, and a gate, the drain of the sixth transistor is coupled with the source of the fifth transistor, and the source of the sixth transistor is coupled with the reference voltage node;

a circuit input configured to receive an input signal having a fourth voltage less than or equal to the third voltage;

a first delay element coupled with the circuit input and the gate of the first transistor, the first delay element is configured to receive the input signal and to output a first delayed signal having a fifth voltage ranging from the second voltage to the first voltage;

a second delay element coupled with the circuit input and the gate of the sixth transistor, the second delay element is configured to receive the input signal and to output a second delayed signal having a sixth voltage less than or equal to the third voltage;

a circuit output coupled with the drain of the third transistor and the drain of the fourth transistor; and a bias generator having an input and an output, the input of the bias generator is coupled with the circuit output, and the output of the bias generator is coupled with the gate of the third transistor and the gate of the fourth transistor, wherein the bias generator is configured to output a third delayed signal having a seventh voltage ranging from the third voltage to the second voltage.

2. The circuit of claim 1, wherein the bias generator is configured to determine a difference between the seventh voltage and an eighth voltage at the circuit output in one or more of a receiver mode, a transmit mode, or a power-down mode, and the bias generator is configured to adjust the seventh voltage to maintain an absolute value of the difference between the seventh voltage and the eighth voltage to be less than or equal to the third voltage.

3. The circuit of claim 2, wherein the bias generator comprises:

a seventh transistor having a source, a drain, and a gate, the source of the seventh transistor is coupled with the circuit output, and the seventh transistor is a PMOS transistor;

an eighth transistor having a source, a drain, and a gate, the source of the eighth transistor is coupled with the circuit output, and the eighth transistor is an NMOS transistor;

a low pass selector coupled with the drain of the seventh transistor, the low pass selector is configured to handle a first voltage swing ranging from the third voltage to the first voltage; and a high pass selector coupled with the drain of the eighth transistor, the high pass selector is configured to handle a second voltage swing ranging from the fourth voltage or the sixth voltage to the second voltage.

4. The circuit of claim 3, wherein the low pass selector handles the first voltage swing by performing a first comparison of the second voltage with the eighth voltage, and the high pass selector handles the second voltage swing by performing a second comparison of the third voltage with the eighth voltage, and the seventh voltage is based on the first comparison and the second comparison.

5. The circuit of claim 2, wherein the first transistor, the second transistor and the third transistor are PMOS transistors, and the fourth transistor, the fifth transistor, and the sixth transistor are NMOS transistors.

6. The circuit of claim 2, wherein the circuit output comprises a first node, a resistor, and a second node coupled in series, the input of the bias generator is coupled with the first node, and the second node is an output pad.

7. The circuit of claim 2, wherein the bias generator comprises:

a resistor ladder comprising a plurality of resistors, the plurality of resistors coupled in series between the circuit output and the reference voltage node; and a feedback path coupled with the resistor ladder at a node between a first third of the resistors of the plurality of resistors and a second third of the resistors of the plurality of resistors, the first third of the resistors of the plurality of resistors being closer to the reference voltage node than the second third of the resistors of the plurality of resistors, wherein the resistor ladder is configured to monitor the difference between the seventh voltage and the eighth voltage based on a total resistance of the resistors of the plurality of resistors between the circuit output and the node for a voltage difference less than or equal to the third voltage.

8. The circuit of claim 2, wherein the bias generator comprises:

a resistor ladder comprising a plurality of resistors, the plurality of resistors coupled in series between the circuit output and the reference voltage node; and a feedback path coupled with the resistor ladder at a node between a first third of the resistors of the plurality of resistors and a second third of the resistors of the plurality of resistors, the first third of the resistors of the plurality of resistors being closer to the circuit output than the second third of the resistors of the plurality of resistors, wherein the resistor ladder is configured to monitor the difference between the seventh voltage and the eighth voltage based on a total resistance of the resistors of the plurality of resistors between the circuit output and the node for a voltage difference less than or equal to the second voltage.

9. A circuit, comprising:

a voltage supply node configured to carry a first voltage;

a reference voltage node configured to carry a reference ground voltage;

a first current mirror having an input and an output, the input of the current mirror is coupled with the voltage supply node;

a first transistor having a source, a drain, and a gate, the source of the first transistor is coupled with the output of the first current mirror, and the gate of the first transistor is configured to receive a first bias signal having a second voltage less than the first voltage;

a second transistor having a source, a drain, and a gate, the source of the second transistor is coupled with the drain of the first transistor;

a third transistor having a source, a drain, and a gate, the drain of the third transistor is coupled with the drain of the second transistor;

a fourth transistor having a source, a drain, and a gate, the drain of the fourth transistor is coupled with the source of the third transistor, and the gate of the fourth transistor is configured to receive a second bias signal having a third voltage less than the second voltage;

a second current mirror having an input and an output, the output of the second current mirror is coupled with the source of the fourth transistor, and the input of the second current mirror is coupled with the reference voltage node;

a circuit input configured to receive an input signal having a fourth voltage less than or equal to the third voltage;

a shift element coupled with the circuit input, the first current mirror along a first path, the gate of the second transistor and the gate of the third transistor along a second path, and the second current mirror along a third path, the shift element is configured to receive the input signal and to (1) output a first delayed signal having a fifth voltage ranging from second voltage to the first voltage to the first path, (2) output a second delayed signal having a sixth voltage ranging from the third voltage to the second voltage to the second path, and (3) output a third delayed signal having a seventh voltage less than or equal to the third voltage to the third path;

a first current controller coupled between the shift element and the first current mirror in the first path, the first current controller is configured to selectively activate the first current mirror;

a second current controller coupled between the shift element and the second current mirror in the third path, the second current controller is configured to selectively activate the second current mirror; and a circuit output coupled with the drain of the second transistor and the drain of the third transistor.

10. The circuit of claim 9, further comprising:
an adjustable current bias generator coupled with the first current mirror and the second current mirror, the adjustable current bias generator is configured to generate a first current and a second current, the first current is selectively mirrored by the first current mirror, and the second current is selectively mirrored by the second current mirror,
wherein
activation of one or more of the first current mirror or the second current mirror modifies one or more of a pull-up driving strength or a pull-down driving strength of an output signal transmitted from the circuit output, and
the pull-up driving strength or the pull-down driving strength is further modified based on one or more of the first current or the second current generated by the adjustable current bias generator.

11. The circuit of claim 10, wherein the adjustable current bias generator is configured to adjust one or more of the first current or the second current within a predetermined range.

12. The circuit of claim 10, wherein the adjustable current bias generator is coupled with the first current controller and the second current controller, the first current is supplied to the first current mirror by way of the first current controller and the second current is supplied to the second current mirror by way of the second current controller.

13. The circuit of claim 10, wherein
the first current mirror comprises:
a first switch; and
a fifth transistor having a source, a drain, and a gate, the source of the fifth transistor is the input of the first current mirror coupled with the voltage supply node, the drain of the fifth transistor is the output of the first current mirror coupled with the source of the first transistor, and the gate of the fifth transistor is coupled with the first switch; and
the second current mirror comprises:
a second switch; and
a sixth transistor having a source, a drain, and a gate, the source of the sixth transistor is the input of the second current mirror coupled with the reference voltage node, the drain of the sixth transistor is the output of the second current mirror coupled with the source of the fourth transistor, and the gate of the sixth transistor is coupled with the second switch, the first circuit controller is configured to selectively activate the first current mirror by closing the first switch,
the second circuit controller is configured to selectively activate the second current mirror by closing the second switch,
the first current is supplied to the gate of the fifth transistor if the first switch is closed, and
the second current is supplied to the gate of the sixth transistor if the second switch is closed.

14. A circuit, comprising:
a voltage supply node configured to carry a first voltage;
a reference voltage node configured to carry a reference ground voltage;
a first current mirror having an input and an output, the input of the current mirror is coupled with the voltage supply node;
a first transistor having a source, a drain, and a gate, the source of the first transistor is coupled with the output of the first current mirror, and the gate of the first transistor is configured to receive a first bias signal having a second voltage less than the first voltage;
a second transistor having a source, a drain, and a gate, the source of the second transistor is coupled with the drain of the first transistor;
a third transistor having a source, a drain, and a gate, the drain of the third transistor is coupled with the drain of the second transistor;
a fourth transistor having a source, a drain, and a gate, the drain of the fourth transistor is coupled with the source of the third transistor, and the gate of the fourth transistor is configured to receive a second bias signal having a third voltage less than the second voltage;
a second current mirror having an input and an output, the output of the second current mirror is coupled with the source of the fourth transistor, and the input of the second current mirror is coupled with the voltage reference node;
a circuit input configured to receive an input signal having a fourth voltage less than or equal to the third voltage;
a first delay element coupled with the circuit input and the first current mirror along a first path, the first delay element is configured to receive the input signal and to output a first delayed signal having a fifth voltage ranging from the second voltage to the first voltage;
a second delay element coupled with the circuit input and the second current mirror along a second path, the second delay element is configured to receive the input signal and to output a second delayed signal having a sixth voltage less than or equal to the third voltage;
a first current controller coupled between the first delay element and the first current mirror in the first path, the first current controller is configured to selectively activate the first current mirror;

a second current controller coupled between the second delay element and the second current mirror in the second path, the second current controller is configured to selectively activate the second current mirror; and a circuit output coupled with the drain of the second transistor and the drain of the third transistor; and a bias generator having an input and an output, the input of the bias generator is coupled with the circuit output, and the output of the bias generator is coupled with the gate of the third transistor and the gate of the fourth transistor, wherein the bias generator is configured to output a third delayed signal having a seventh voltage ranging from the third voltage to the second voltage.

15. The circuit of claim 14, wherein the bias generator is configured to determine a difference between the seventh voltage and an eighth voltage at the circuit output in one or more of a receiver mode, a transmit mode, or a power-down mode, and the bias generator is configured to adjust the seventh voltage to maintain an absolute value of the difference between the seventh voltage and the eighth voltage to be less than or equal to the third voltage.

16. The circuit of claim 14, wherein activation of one or more of the first current mirror or the second current mirror modifies one or more of a pull-up driving strength or a pull-down driving strength of an output signal transmitted from the circuit output.

17. The circuit of claim 16, further comprising:

an adjustable current bias generator coupled with the first current mirror and the second current mirror, the adjustable current bias generator is configured to generate a first current and a second current, the first current is selectively mirrored by the first current mirror, and the second current is selectively mirrored by the second current mirror, wherein the pull-up driving strength or the pull-down driving strength is further modified based on one or more of the first current or the second current generated by the adjustable current bias generator.

18. The circuit of claim 17, wherein the adjustable current bias generator is coupled with the first current controller and the second current controller, the first current is supplied to the first current mirror by way of the first current controller and the second current is supplied to the second current mirror by way of the second current controller.

19. The circuit of claim 17, wherein the first current mirror comprises:

a first switch; and a fifth transistor having a source, a drain, and a gate, the source of the fifth transistor is the input of the first current mirror coupled with the voltage supply node, the drain of the fifth transistor is the output of the first current mirror coupled with the source of the first transistor, and the gate of the fifth transistor is coupled with the first switch; and the second current mirror comprises:

a second switch; and a sixth transistor having a source, a drain, and a gate, the source of the sixth transistor is the input of the second current mirror coupled with the reference voltage node, the drain of the sixth transistor is the output of the second current mirror coupled with the source of the fourth transistor, and the gate of the sixth transistor is coupled with the second switch, the first current controller is configured to selectively activate the first current mirror by closing the first switch, the second current controller is configured to selectively activate the second current mirror by closing the second switch, the first current is supplied to the gate of the fifth transistor if the first switch is closed, and the second current is supplied to the gate of the sixth transistor if the second switch is closed.

20. The circuit of claim 14, wherein the bias generator comprises:

a low pass selector coupled with the circuit output, the low pass selector is configured to handle a first voltage swing ranging from the third voltage to the first voltage; and a high pass selector coupled with the circuit output, the high pass selector is configured to handle a fourth voltage swing ranging from the fourth voltage or the sixth voltage to the second voltage.

* * * * *